(12) United States Patent
Bao et al.

(10) Patent No.: US 7,122,828 B2
(45) Date of Patent: Oct. 17, 2006

(54) SEMICONDUCTOR DEVICES HAVING REGIONS OF INDUCED HIGH AND LOW CONDUCTIVITY, AND METHODS OF MAKING THE SAME

(75) Inventors: Zhenan Bao, Millburn, NJ (US); Howard Edan Katz, Summit, NJ (US); Jeffrey Scott Meth, Landenberg, PA (US)

(73) Assignees: Lucent Technologies, Inc., Murray Hill, NJ (US); E.I. du Pont de Nemours and Company, Wilmington, DE (US)

( * ) Notice: Subject to any disclaimer, the term of this patent is extended or adjusted under 35 U.S.C. 154(b) by 63 days.

(21) Appl. No.: 10/671,303

(22) Filed: Sep. 24, 2003

(65) Prior Publication Data
US 2005/0062066 A1 Mar. 24, 2005

(51) Int. Cl.
*H01L 35/24* (2006.01)
(52) U.S. Cl. .......................................... 257/40; 438/99
(58) Field of Classification Search .................. 438/99; 257/40
See application file for complete search history.

(56) References Cited

U.S. PATENT DOCUMENTS

| | | | |
|---|---|---|---|
| 5,192,580 A | 3/1993 | Blanchet-Fincher | |
| 5,288,528 A | 2/1994 | Blanchet-Fincher | |
| 5,347,144 A | 9/1994 | Garnier et al. | |
| 5,523,192 A | 6/1996 | Blanchet-Fincher | |
| 5,563,019 A | 10/1996 | Blanchet-Fincher | |
| 5,625,199 A | 4/1997 | Baumbach et al. | |
| 5,766,819 A | 6/1998 | Blanchet-Fincher | |
| 5,840,463 A | 11/1998 | Blanchet-Fincher | |
| 5,981,970 A | 11/1999 | Dimitrakopoulos et al. | |
| 6,051,318 A | 4/2000 | Kwon | |
| 6,143,451 A | 11/2000 | Blanchet-Fincher | |
| 6,146,792 A | 11/2000 | Blanchet-Fincher et al. | |
| 6,174,651 B1 | 1/2001 | Thakur | |
| 6,265,243 B1 | 7/2001 | Katz et al. | |
| 6,352,811 B1 | 3/2002 | Patel et al. | |
| 6,352,812 B1 | 3/2002 | Shimazu et al. | |
| 6,403,397 B1 * | 6/2002 | Katz ........................... | 438/99 |
| 6,551,717 B1 | 4/2003 | Katz et al. | |

(Continued)

FOREIGN PATENT DOCUMENTS

WO  WO 01/87634 A2  11/2001

(Continued)

OTHER PUBLICATIONS

Morphological Origin of High Mobility in Pentacene Thin film transistors, Laquindanum et al. Chem Matter vol. 8 No. 11 pp 2542-2544.*

(Continued)

*Primary Examiner*—Bradley K. Smith
(74) *Attorney, Agent, or Firm*—Jay M. Brown; The Eclipse Group

(57) ABSTRACT

Semiconductor apparatus comprising: a substrate having a substrate surface; a layer of a first material overlying a first region of the substrate surface; a layer of a semiconductor overlying the layer of first material and overlying a second region of the substrate surface; a first region of the layer of semiconductor, overlying the layer of first material and having a first conductivity; a second region of the layer of semiconductor, overlying the second region of the substrate surface and having a second conductivity; and the first conductivity being substantially different from the second conductivity. Such semiconductor apparatus further comprising a layer of a second material overlying the second region of the substrate surface, the second region of the layer of semiconductor overlying the layer of the second material.

32 Claims, 14 Drawing Sheets

U.S. PATENT DOCUMENTS

2002/0149315 A1 10/2002 Blanchet-Fincher
2003/0175551 A1 9/2003 Smith et al. ............... 428/690

FOREIGN PATENT DOCUMENTS

WO WO 02/08801 A1 1/2002
WO WO 02/092352 A1 11/2002

OTHER PUBLICATIONS

U.S. Appl. No. 10/256,885, filed Sep. 27, 2002, Bao et al.
U.S. Appl. No. 10/669,780, filed Sep. 24, 2003, Bao.
U.S. Appl. No. 60/505,533, Meth, filed Sep. 24, 2003.
U.S. Appl. No. 60/505,880, Meth et al, filed Sep. 24, 2003.
U.S. Appl. No. 10/701,183, filed Nov. 4, 2003, Akkerman et al.
U.S. Appl. No. 10/722,613, filed Nov. 26,2003, Aizenberg et al.
Afzali et al., High-Performance, Solution-Processed Organic Thin Film Transistors from a Novel Pentacene Precursor, J. Am. Chem. Soc., 2002, Page(s) 8812-8813, vol. 124.
Afzali et al., Synthesis and Application of Pentacene Precursor in OTFT, Publisher: IBM Research Division, Published in: Yorktown Heights, NY.
Aizenberg et al., Control of Crystal Nucleation by Patterned Self-Assembled Monolayers, Nature, Apr. 8, 1999, Page(s) 495-498, vol. 398.
Aizenberg et al., Oriented Growth of Calcite Controlled by Self-Assembled Monolayers of Functionalized Alkanethiols Supported on Gold and Silver, J. Am. Chem. Soc., 1999, Page(s) 4500-4509, vol. 121.
Akimichi et al., Field-Effect Transistors Using Alkyl Substituted Oligothiophenes, Appl. Phys. Lett., 1991, Page(s) 1500-1502, vol. 58, No. 14.
Butko et al., Limit of Field Effect Mobility on Pentacene Single Crystal, Publisher: Los Alamos National Laboratory, Published in: Los Alamos, New Mexico.
Cai et al., Self Assembly in Ultrahigh Vacuum: Growth of Organic Thin Films with a Stable In-Plane Directional Order, J. Am. Chem. Soc., 1998, Page(s) 8563-8564, vol. 120.
Collet et al., High Anisotropic Conductivity in Organic Insulator/Semiconductor Monolayer Heterostructure, Applied Physics Letters, Mar. 6, 2000, Page(s) 1339-1341, vol. 76, No. 10, Publisher: American Institute of Physics.
Collet et al., Low-Voltage, 30 nm Channel Length, Organic Transistors with a Self-Assembled Monolayer as Gate Insulating Films, Applied Physics Letters, Apr. 3, 2000, Page(s) 1941-1943, vol. 76, No. 14.
Collet et al., Nano-field Effect Transistor with an Organic Self-Assembled Monolayer as Gate Insulator, Applied Physics Letters, Nov. 2, 1998, Page(s) 2681-2683, vol. 73, No. 18.
De Boer et al., Synthesis and Characterization of Conjugated Mono- and Dithiol Oligomers and Characterization of Their Self-Assembled Monolayers, Langmuir, 2003, Page(s) 4272-4284, vol. 19.
Echavarren et al., J. Am. Chem. Soc., 1987, Page(s) 5478-5486, vol. 109.
Forrest, Ultrathin Organic Films Grown by Organic Molecular Beam Deposition and Related Techniques, Chem. Rev., Page(s) 1793-1896, vol. 97, Publisher: American Chemical Society.
Halik et al., High-Mobility Organic Thin-Film Transistors Based on a, a'-didecyloligothiophenes, Journal of Applied Physics, Mar. 1, 2003, Page(s) 2977-2981, vol. 93, No. 5.
Han et al., Effect of Magnesium Ions on Oriented Growth of Calcite on Carboxylic Acid Functionalized Self-Assembled Monolayer, J. Am. Chem. Soc., 2003, Page(s) 4032-4033, vol. 125.
Han et al., Face-Selective Nucleation of Calcite on Self-Assembled Monolayers of Alkanethiols: Effect of the Parity of the Alkyl Chain, Angew. Chem. Int. Ed., 2003, Page(s) 3668-3670, vol. 42.
Hong et al., Thiophene-Phenylene and Thiophene-Thiazole Oligomeric Semiconductors with High Field-Effect Transistor On/Off Ratios, Chem. Mater., 2001, Page(s) 4686-4691, vol. 13, No. 12.
Johnston et al., Low-Energy Vibrational Modes in Phenylene Oligomers Studied by THz Time-Domain Spectroscopy, Chemical Physics Letters, 2003, Page(s) 256-262, vol. 377.
Katz et al., Synthesis, Solubility, and Field-Effect Mobility of Elongated and Oxa-substituted a,w-Dialkyl Thiophene Oligomers: Extension of 'Polar Intermediate' Synthetic Strategy and Solution Deposition on Transistor Substrates, Chem. Mater., 1998, Page(s) 633-638, vol. 10, No. 2.
Klauk et al., High-Mobility Polymer Gate Dielectric Pentacene Thin Film Transistors, Journal of Applied Physics, Nov. 1, 2002, Page(s) 5259-5263, vol. 92, No. 9.
Klauk et al., Pentacene Organic Thin-Film Transistors and ICs, Solid State Technology, Mar. 2000, Page(s) 63-76, vol. 43, No. 3.
Li et al., Field-Effect Transistors Based on Thiophene Hexamer Analogues with Diminished Electron Donor Strength, Chem. Mater., 1999, Page(s) 458-465, vol. 11, No. 2.
Matters et al., Organic Field-Effect Transistors and All-Polymer Integrated Circuits, Optical Materials, 1999, Page(s) 189-197, vol. 12.
Meyer Zu Heringdorf et al., Growth Dynamics of Pentacene Thin Films, Nature, Aug. 2, 2001, Page(s) 517-520, vol. 412.
Mushrush et al., Easily Processable Phenylene-Thiophene-Based Organic Field-Effect Transistors and Solution-Fabricated Nonvolatile Transistor Memory Elements, J. Am. Chem. Soc., 2003, Page(s) 9414-9423, vol. 125, No. 31.
Seo et al., Interpretation of the Mass Change Behavior in the Binary Monolayer of Hydroquinone-tethered Alkylthiol and Aminoalkythiol, Bull. Korean Chem. Soc., 2002, Page(s) 1671-1673, vol. 23, No. 11.
Stabel et al., Scanning Tunneling Micropscopy of Alkylated Oligothiophenes at Interfaces with Graphite, Synthetic Metals, 1994, Page(s) 47-53, vol. 67.
Tanimoto et al., Binary Phase Chlorination of Aromatic Hydrocarbons with Solid Copper(II) Chloride: Reaction Mechanism, Bull. Chem. Soc. Japan, 1979, Page(s) 3586-3591, vol. 52, No. 12.
Xia et al., Soft Lithography, Angew. Chem. Int. Ed., 1998, Page(s) 550-575, vol. 37.
Qin, Dong et al., "Fabrication of Ordered Two-Dimensional Arrays of Micro- and Nanoparticles Using Patterned Self-Assembled Monolayers as Templates", *Adv. Mater.*, vol. 11, No. 17, pp. 1433-1437 (1999).
Qin et al., "Fabrication of Ordered Two-Dimensional Arrays of Micro- and Nanoparticles Using Patterned Self-Assembled Monolayers as Templates", *Adv. Mater.*, vol. 11, No. 17, pp. 1433-1437 (1999).
Steudel et al., "Patterned growth of pentacene", *Applied Physics Letters*, vol. 85, No. 23, pp. 5500-5552 (Dec. 6, 2004).

* cited by examiner

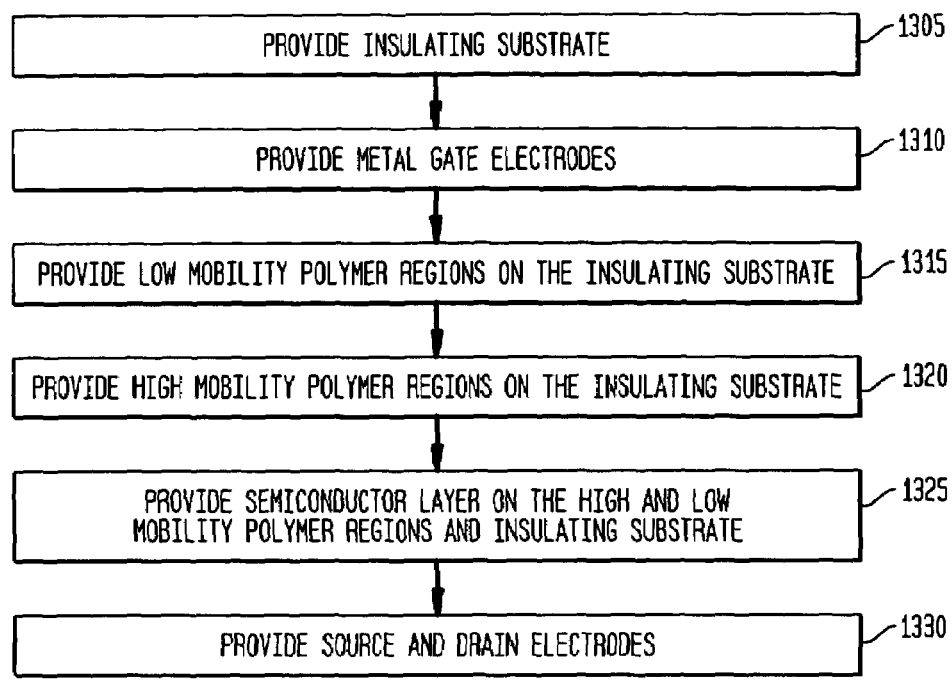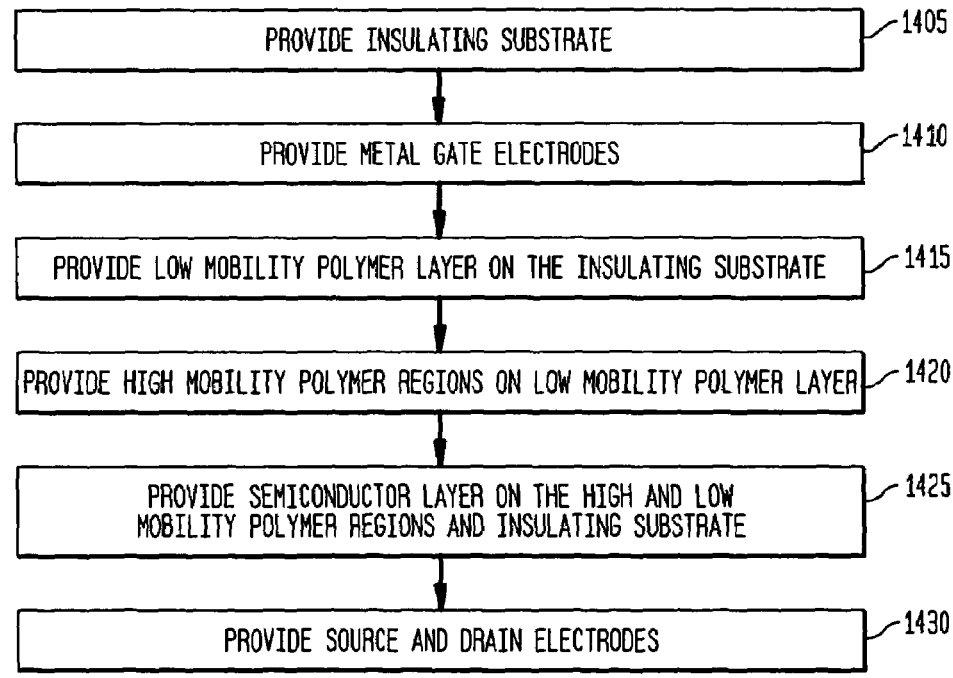

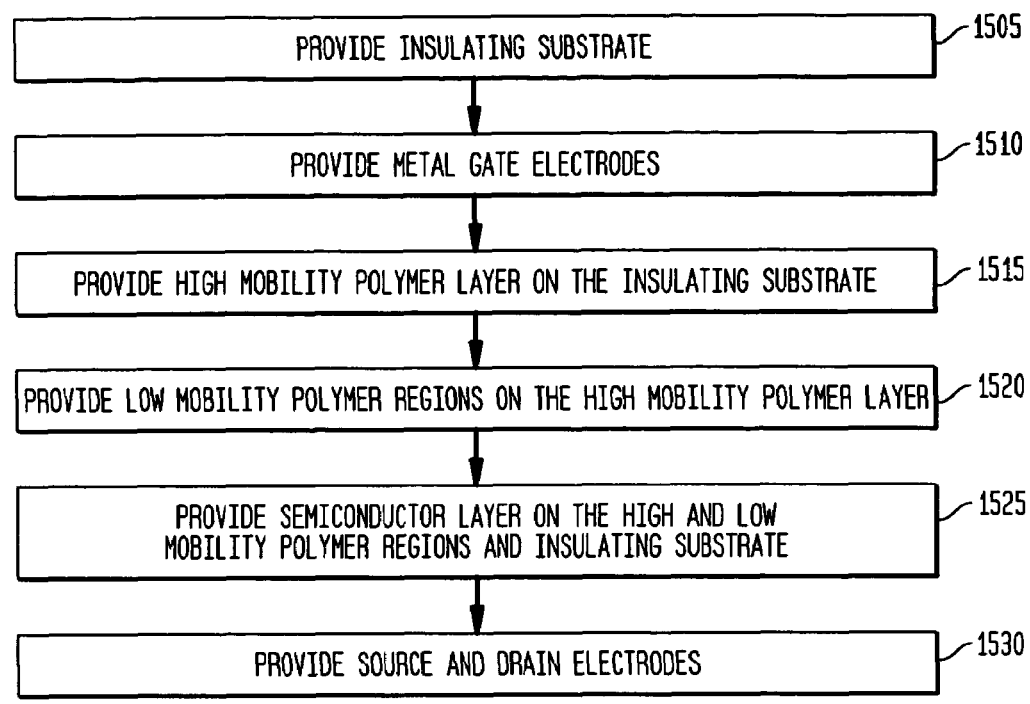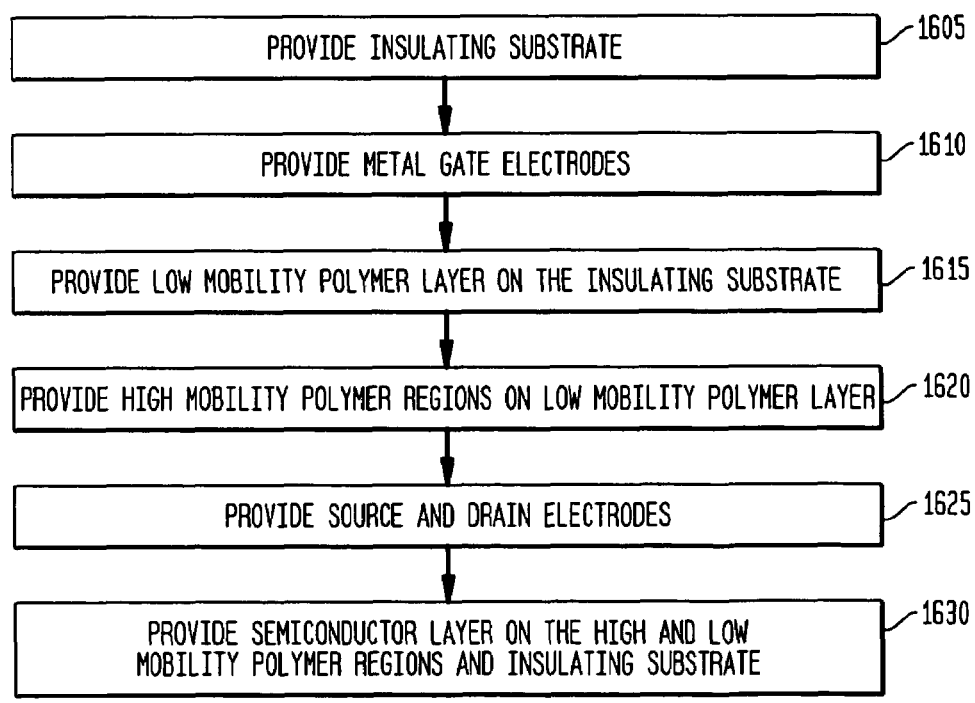

FIG. 17
TABLE 1

| semiconductor | dielectric | mobility cm²/Vs | S.D. of mobility | V threshold V | S.D. of Vt | on/off ratio | subthreshold swing V/decade | # samples | substrate T (if not ambient) |
|---|---|---|---|---|---|---|---|---|---|
| pentacene | PVPyr | 1.2E+00 | 1.5E+00 | -22 | 8.6 | 1260 | 9.8 | 11 | 60 deg. C |
| pentacene | PVDFMVE | 1.9E-04 | 3.2E-05 | -6.7 | 0.3 | 140 | 8.7 | 4 | 60 deg. C |
| pentacene | PBMA | <1E-05 | | | | | | | 60 deg. C |
| pentacene | PVPhenol | 4.80E-01 | 1.50E-01 | -19.9 | 4.2 | 2.00E+03 | 7.1 | 2 | |
| pentacene | PVPhenol | 1.10E+00 | NA | 13.9 | NA | 2670 | 2.7 | 1 | 80 deg. C |
| 2PTTP2 | PBMA | 5.0E-05 | 7.4E-06 | -14 | 4.1 | 16 | 5.8 | 5 | |
| 2PTTP2 | PVPyr | 4.1E-04 | 1.9E-04 | 41 | 3.8 | 523 | 12.6 | 3 | |
| 2PTTP2 | PVDFMVE | 2.5E-03 | 2.3E-03 | -2.1 | 3.4 | 1320 | 6.2 | 4 | |
| DHFTTF | PBMA | 5.9E-05 | 5.0E-05 | -9.7 | 14.7 | 19.8 | 24.3 | 3 | |
| DHFTTF | PVPyr | 3.4E-04 | 1.6E-04 | -7.1 | 7.3 | 68 | 25.5 | 4 | |
| DHFTTF | PVDFMVE | <1E-05 | | | | | | | |

SEMICONDUCTOR DEVICES HAVING REGIONS OF INDUCED HIGH AND LOW CONDUCTIVITY, AND METHODS OF MAKING THE SAME

The U.S. Government has a paid-up license in this invention and the right in limited circumstances to require the patent owners to license others on reasonable terms as provided for by the terms of Advanced Technology Program Cooperative Agreement No. 70NANB2H3032 awarded by the National Institute of Standards and Technology.

FIELD OF THE INVENTION

The present invention relates to semiconductor devices and circuits containing semiconductor devices.

TECHNICAL BACKGROUND OF THE INVENTION

Semiconductor devices are typically formed as multilayer structures in which the semiconductor materials are present in a patterned array that defines channels for the transport of charge carriers. For example, an inorganic semiconductor layer may be applied to a dielectric substrate surface. A mask may then be applied to protect regions of the semiconductor layer, intended to constitute charge carrier channels, from a subsequently applied etchant. The etchant then removes the semiconductor in the unmasked regions, leaving behind a finely patterned array of semiconductor channels on the substrate. In the absence of such patterning, the semiconductor devices may be inoperable or be subject to excessive crosstalk.

Inorganic semiconductors typically are rigid and brittle at ambient temperatures. Hence, semiconductor devices formed with inorganic semiconductors generally are rigid as well. As the myriad end use applications for semiconductor devices have evolved, availability of semiconductor devices that can be flexed and bent without damage is desirable. Flexible semiconductor device structures also offer potential capability for bulk processing in the fabrication of large area device arrays, such as a continuous web for example, at low unit costs.

Much work has been done to develop organic semiconductors for applications where flexible semiconductor devices are needed. However, organic semiconductors generally cannot survive the harsh conditions required in order to carry out an etching step to generate a patterned array of channels for charge carrier transport. Printing processes have accordingly been sought in order to directly provide a patterned semiconductor channel array without a need to remove regions of a continuous layer of material. Unfortunately, the fine feature definition that is needed to generate microarrays of semiconductor channels has not been attained by printing of organic semiconductors.

Pentacene, for example, has become an organic semiconductor of great interest due to its high conductivity when formed into a crystalline film. Single dendritic crystals of pentacene having dimensions as large as 2 millimeters long, 1 millimeter wide, and 0.5 millimeter thick have been produced. For example, individual thin film field effect transistors comprising single pentacene crystals have been made with high channel mobilities within a range of between about 1 centimeter squared per volt-second ($cm^2$/Vs) and about 5 $cm^2$/Vs, at room temperature. However, these individual thin film field effect transistors often have low on/off current ratios, and are not integrated into a circuit.

Pentacene is known to have high conductivity when formed on substrates comprising poly(vinylphenol). However, direct patterning of pentacene leads to poorly defined and irregular channel boundaries that cannot be used in fabricating semiconductor devices such as transistors or arrays comprising transistors.

One effort to generate a suitably patterned array of semiconductor channels comprising pentacene involved the direct printing of a pentacene precursor, which was then converted into pentacene. See, for example, Dimitrakopoulos et al. U.S. Pat. No. 5,981,970, entitled, "Thin-film field-effect transistor with organic semiconductor requiring low operating voltages." However, the performance of semiconductor devices made by this process was unsatisfactory. For example, the process required a high temperature annealing step that degraded the semiconductor devices. Further, two different material patterning methods were needed. The stability of the resulting semiconductor devices was also unreliable.

Another process for forming devices utilizing patterned organic semiconductor films, disclosed in Katz U.S. Pat. No. 6,403,397 issued on Jun. 11, 2002 and entitled "Process For Fabricating Organic Semiconductor Device Involving Selective Patterning," involved treating a surface to selectively provide regions of greater affinity and lesser affinity for an organic semiconductor or an organic semiconductor solution. When the organic semiconductor, or solution comprising the semiconductor, was deposited on the treated surface, either the organic semiconductor or the organic semiconductor solution dewetted from the lesser affinity regions or the resultant film adhered only weakly to the lesser affinity regions such that selective removal was readily performed. Even where such removal was not performed, the portions of the organic semiconductor film overlying the greater affinity regions exhibited higher conductivity and better film continuity relative to the other portions of the film.

There remains a need for semiconductor devices comprising semiconductors having finely patterned regions of high and low conductivity. There further is a need for methods of making semiconductor devices employing semiconductors that are not easily patterned.

SUMMARY OF THE INVENTION

The present invention provides semiconductor apparatus in which regions of high and low conductivity are induced in a semiconductor by regions of materials placed in contact with the semiconductor, and methods of making such semiconductor apparatus. Exemplary embodiments employ organic semiconductors and utilize polymers as such materials. Semiconductor devices can be made with organic and inorganic semiconductors according to the present invention without patterned placement or removal of the semiconductors.

In one embodiment according to the present invention, a semiconductor apparatus is provided, comprising: a substrate having a substrate surface; a layer of a first material overlying a first region of the substrate surface; a layer of a semiconductor overlying the layer of first material and overlying a second region of the substrate surface; a first region of the layer of semiconductor, overlying the layer of first material and having a first conductivity; a second region of the layer of semiconductor, overlying the second region of the substrate surface and having a second conductivity; and the first conductivity being substantially different from the second conductivity.

In another embodiment according to the present invention, such a semiconductor apparatus is provided, further comprising a layer of a second material overlying the second region of the substrate surface, the second region of the layer of semiconductor overlying the layer of the second material. In an additional embodiment according to the present invention, such a semiconductor apparatus is provided in which the layer of first material overlies the second region of the substrate surface.

In a further embodiment according to the present invention, such a semiconductor apparatus is provided in which the conductivity in the first region of the layer of semiconductor is at least about 100 times as large as the conductivity in the second region of the layer of semiconductor. In another embodiment according to the present invention, such a semiconductor apparatus is provided in which the layer of semiconductor comprises crystal grains, and in which the average crystal grain size within the first region of the layer of semiconductor is at least about 10 times as large as the average crystal grain size within the second region of the layer of semiconductor. In an additional embodiment according to the present invention, such a semiconductor apparatus is provided in which the layer of semiconductor comprises crystal grains, and in which the average separation between crystal grains within the second region of the layer of semiconductor is at least about 10 times as large as the average separation between crystal grains within the first region of the layer of semiconductor.

In a further embodiment according to the present invention, a method of making a semiconductor apparatus is provided, comprising the steps of: providing a substrate having a substrate surface; providing a layer of a first material overlying a first region of the substrate surface; and providing a layer of a semiconductor overlying the layer of first material and overlying a second region of the substrate surface; a first region of the layer of semiconductor, overlying the layer of first material and having a first conductivity; a second region of the layer of semiconductor, overlying the second region of the substrate surface and having a second conductivity; and the first conductivity being substantially different from the second conductivity.

In another embodiment according to the present invention, such a method of making a semiconductor apparatus is provided, further comprising the step of providing a layer of a second material overlying the second region of the substrate surface, the second region of the layer of semiconductor overlying the layer of the second material. In an additional embodiment according to the present invention, such a method of making a semiconductor apparatus is provided, in which the layer of first material overlies the second region of the substrate surface.

In further embodiments according to the present invention, integrated circuits comprising semiconductor apparatus, and methods for making such integrated circuits, are provided.

A more complete understanding of the present invention, as well as further features and advantages of the invention, will be apparent from the following detailed description and the accompanying drawings.

BRIEF DESCRIPTION OF THE DRAWINGS

The present invention will be better understood from reading the following description of non-limiting embodiments, with reference to the attached drawings, wherein below:

FIG. 13 shows an exemplary method according to the present invention of making the transistors shown in FIGS. 5 and 6;

FIG. 14 shows an exemplary method according to the present invention of making the transistors shown in FIGS. 7 and 8;

FIG. 15 shows an exemplary method according to the present invention of making the transistors shown in FIG. 9;

FIG. 16 shows an exemplary method according to the present invention of making the transistors shown in FIG. 10; and FIG. 17 shows Table 1, reporting the results of a series of trials that were carried out to fabricate transistors according to exemplary embodiments of the invention.

The drawings of this specification are not to scale but are merely schematic representations, and thus are not intended to portray the specific dimensions of the various embodiments according to the invention, which may be determined by skilled artisans through examination of the disclosure herein.

DETAILED DESCRIPTION OF THE INVENTION

The present invention will now be described more fully with reference to the accompanying drawings, in which several presently preferred embodiments of the invention are shown. This invention may, however, be embodied in various forms and should not be construed as being limited to the embodiments set forth herein. Rather, these embodiments are provided so that this disclosure will be thorough and complete, and will fully convey the scope of the invention to those skilled in the art.

The present invention provides active semiconductor devices, in which regions of relatively high and relatively low conductivity are induced in the semiconductor by a selected adjacent layer.

Figure 1:
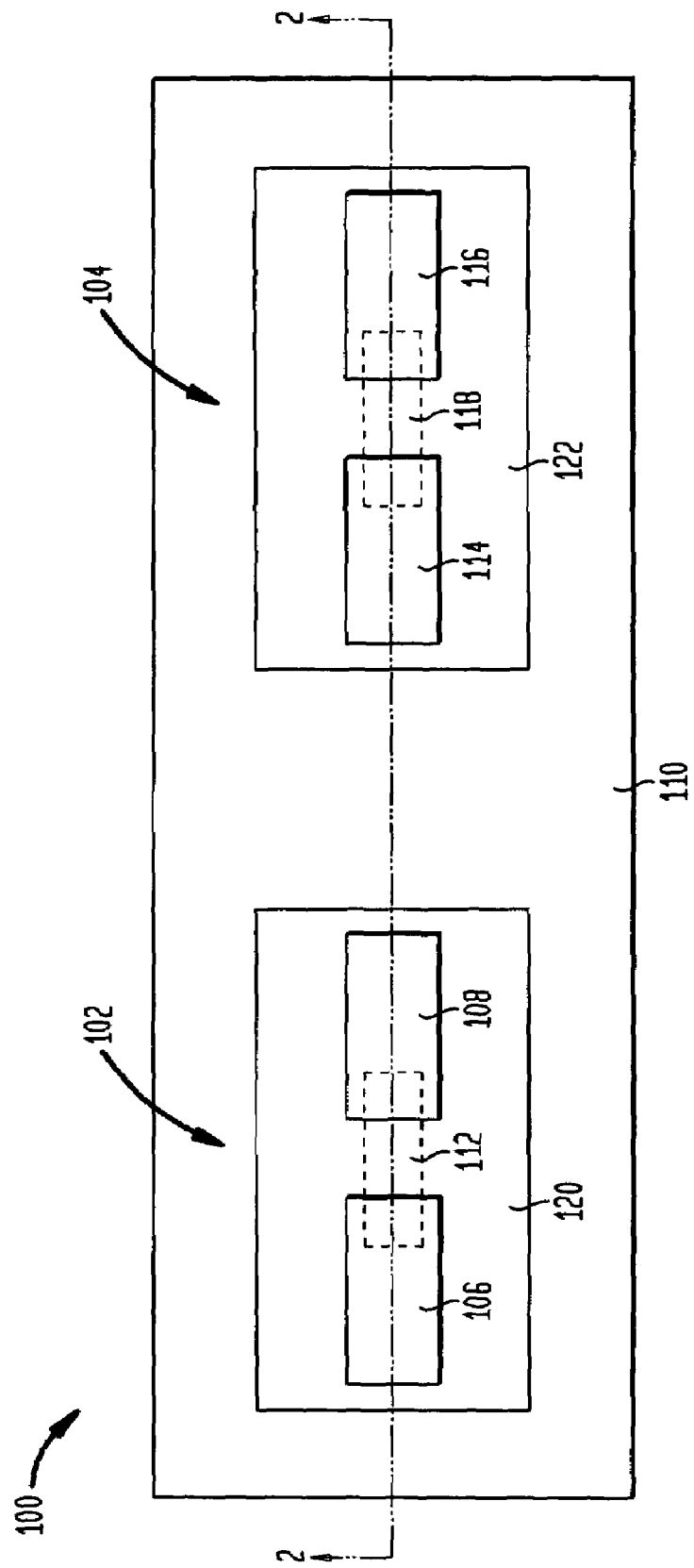
FIG. 1 shows an exemplary embodiment of two thin film transistors according to the present invention.

FIG. 1 shows an exemplary embodiment 100, according to the present invention, of two thin film transistors generally indicated at 102 and 104. Thin film transistor 102 comprises a source electrode 106 and a drain electrode 108 in a spaced apart arrangement overlying a semiconductor layer 110. The subsurface location of a gate electrode 112 for thin film transistor 102 under the semiconductor layer 110 is also shown. Thin film transistor 104 comprises a source electrode 114 and a drain electrode 116 in a spaced apart arrangement overlying the semiconductor layer 110. The subsurface location of a gate electrode 118 for thin film transistor 104 under the semiconductor layer 110 is also shown. Thin film transistors 102 and 104 are further provided with high conductivity inducing layer regions 120 and 122 respectively, the subsurface locations of which under the semiconductor layer 110 are shown.

Figure 2:
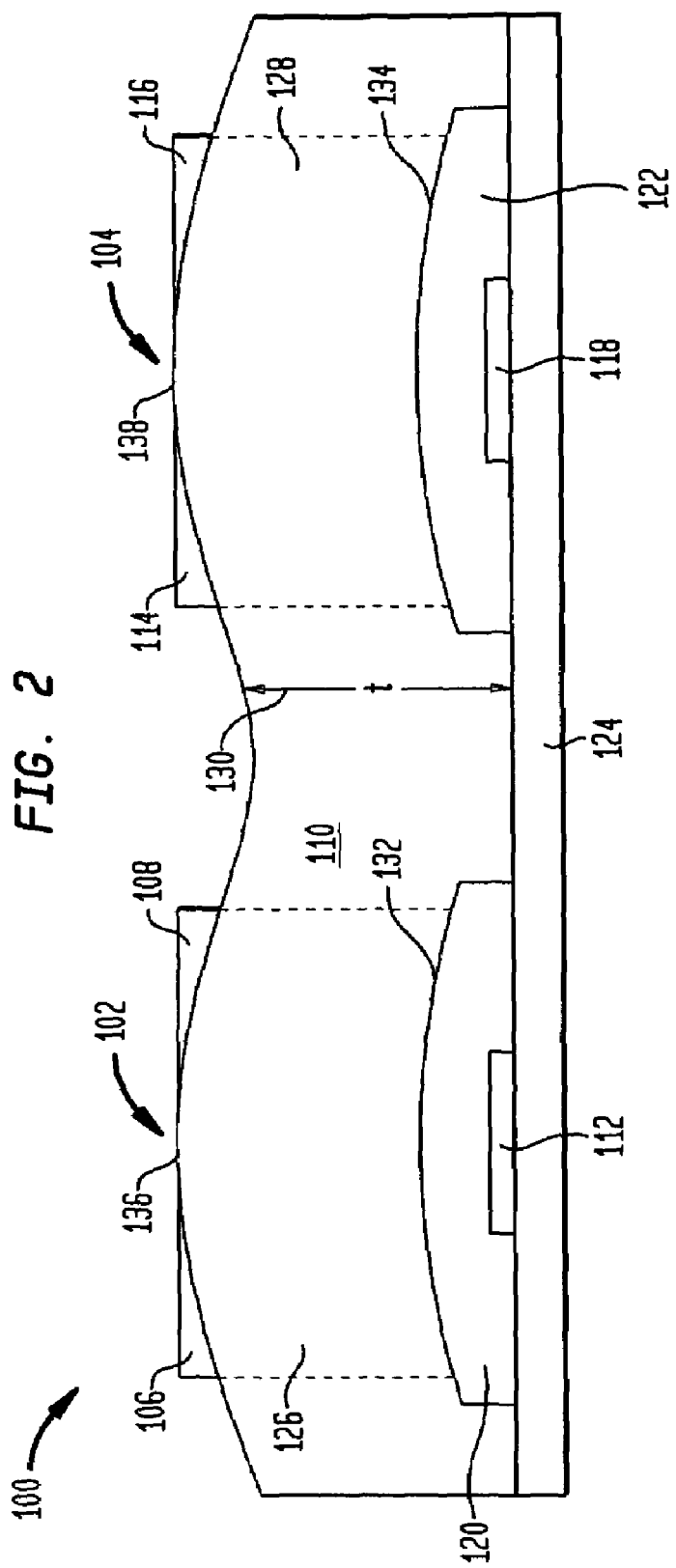
FIG. 2 shows a further view of the exemplary embodiment of two thin film transistors of FIG. 1.

FIG. 2 shows a further view of the exemplary embodiment 100 according to the present invention of thin film transistors 102 and 104, taken on line 2—2 in FIG. 1. The gate electrodes 112 and 118 overlie an insulating substrate 124 in a spaced apart arrangement. High conductivity inducing layer regions 120 and 122 overlie the insulating substrate 124 and cover gate electrodes 112 and 118, respectively. The semiconductor layer 110 overlies the insulating substrate 124 and the high conductivity inducing layer regions 120 and 122. The source electrode 106 and drain electrode 108 of thin film transistor 102 overlie the semiconductor layer 110 in a spaced apart arrangement in alignment over the gate electrode 112. The source electrode 114 and drain electrode 116 of thin film transistor 104 overlie the semiconductor layer 110 in a spaced apart arrangement in alignment over the gate electrode 118. The source electrodes 106 and 114, drain electrodes 108 and 116, and the gate electrodes 112 and 118 are in communication with an electrical circuit, not shown, of which thin film transistors 102 and 104 form a part.

The terms "overlying", "overlies", "overlie" and the like as used in the present specification mean and refer to the relative orientation of the subject structural elements to each other, which elements may either be in direct mutual contact or may be separated by additional interposed elements as in context are indicated. For example, designated regions of exemplary semiconductor layer 110 may overlie and be in direct contact with exemplary insulating substrate 124. Alternatively, designated regions of exemplary semiconductor layer 110 may overlie exemplary insulating substrate 124, but be separated from direct contact with such substrate by interposed exemplary high conductivity inducing layer region 120 or 122. Analogous structures, for example, comprise interposed exemplary low conductivity inducing layer regions, as discussed below.

In one exemplary embodiment according to the present invention, the semiconductor layer 110 is formed by an organic semiconductor. Organic semiconductors are compounds comprising hydrocarbon moieties, and compositions comprising such compounds, that can be formed into a structure that is capable of transporting charge carriers. Pentacene is one specific exemplary organic compound that is capable of so transporting charge carriers. Exemplary embodiments according to the present invention will be discussed in the context of pentacene as an organic semiconductor. However, it will be understood that the teachings according to the present invention likewise extend to other organic semiconductors as well as to inorganic semiconductors, and to mixed and hybrid organic and inorganic semiconductors. Conductivity in an organic semiconductor is dependent upon its crystallinity. Electrical conductivity is given by the formula $\sigma = en\mu_d$ where $\mu_d$ is the electron mobility, e is the charge on the electron, and n is the density of free electrons. Conductivity accordingly is proportional to mobility. Mobility can readily be measured. For example, a polycrystalline film of pentacene provides a low mobility, within a range between about $0.3 \times 10^{-7}$ cm$^2$/Vs and about $1.5 \times 10^{-5}$ cm$^2$/Vs at room temperature. In contrast, where crystallization of pentacene is encouraged as by its thermal evaporation in a vacuum or by growing a pentacene film from the vapor phase in a stream of inert gas, mobilities within a range between about 1 cm$^2$/Vs and about 5 cm$^2$/Vs at room temperature can be achieved.

Conductivity in an organic semiconductor depends on the size and separation of crystal grains. The size distribution of crystal grains determines how many of them must be effectively traversed by a charge carrier in order to be transported from an origin to a destination. The separation between crystal grains determines the impact of non crystalline regions on conductivity. For example, crystal grains separated by a distance greater than the tunneling limit for a particular material may constitute a nonconductive pathway for charge carriers. The tunneling limit is that distance, determined by the uncertainty principle of quantum mechanics, across which molecules may move over time in relation to each other without application of external forces.

Conductivity within a crystal grain of an organic semiconductor depends on charge carrier energy levels and molecular overlaps in the crystal. Energy levels of charge carriers at the boundaries between adjacent crystals along a pathway cannot interpose undue burdens to the transport of charge carriers.

Referring to FIG. 2, high conductivity inducing layer regions 120 and 122 are formed of dielectric materials that increase the conductivity of the semiconductor layer 110 in the semiconductor regions 126 and 128 aligned over gate electrodes 112 and 118, respectively. This increased conductivity results from induced crystalline grain growth within regions 126 and 128 of the semiconductor layer 110. At a molecular level, the high conductivity inducing layer regions 120 and 122 are formed of a material having a structure that constitutes an effective support for a crystalline lattice form of the selected semiconductor. Increased conductivity of the semiconductor layer 110 in the semiconductor region 126 results in increased transconductivity between the source electrode 106 and the drain electrode 108 of thin film transistor 102. Increased conductivity of the semiconductor layer 110 in the semiconductor region 128 results in increased transconductivity between the source electrode 114 and the drain electrode 116 of thin film transistor 104. Hence, the semiconductor layer 110 is deposited over the high conductivity inducing layer regions 120 and 122 with an increased degree of crystalline lattice order. This enhanced transconductivity increases the capacity of the thin film transistors 102 and 104 to transport charge carriers, thus directly improving the performance of such thin film transistors 102 and 104. The conductivity within regions of the semiconductor layer 110 surrounding the semiconductor regions 126 and 128 is relatively unaffected by the presence of high conductivity inducing layer regions 120 and 122. The capability of such regions of the semiconductor layer 110 to transport charge carriers accordingly is relatively unaffected, leading to reduced crosstalk through the semiconductor layer 110 between thin film transistors 102 and 104.

In one exemplary embodiment according to the present invention, the semiconductor layer 110 shown in FIGS. 1 and 2 is formed from pentacene and has a thickness t, indicated at 130, that is within a range of between about 10 pentacene molecules and about 20 pentacene molecules. This semiconductor layer 110 can be conceptualized as including between about 10 layers of pentacene molecules and about 20 layers of pentacene molecules in a stacked arrangement spanning the thickness t. Pentacene deposited at the interface 132 between high conductivity inducing layer region 120 and semiconductor layer 110 accordingly is induced to have increased crystal grain size. Similarly, pentacene deposited at the interface 134 between high conductivity inducing layer region 122 and semiconductor layer 110 accordingly is induced to have increased crystal grain size. Increased crystal grain size at the interfaces 132 and 134 leads to increased crystal grain size, although to a lesser degree, up through the thickness t of the semiconductor layer 110 in a direction toward the surface regions 136 and 138, respectively.

In operation of the thin film transistor 102, a voltage applied to the gate electrode 112 can be used to control a flow of charge carriers between the source electrode 106 and the drain electrode 108. Similarly, in operation of the thin film transistor 104, a voltage applied to the gate electrode 118 can be used to control a flow of charge carriers between the source electrode 114 and the drain electrode 116. In thin film transistor 102, charge carriers are transported between the source electrode 106 and the drain electrode 108 through the several layers of pentacene molecules nearest the interface 132 between the high conductivity inducing layer region 120 and the semiconductor layer 110. Similarly in thin film transistor 104, charge carriers are transported between the source electrode 114 and the drain electrode 116 through the several layers of pentacene molecules nearest the interface 134 between the high conductivity inducing layer region 122 and the semiconductor layer 110. Although these several layers of pentacene molecules typically are not monocrystalline, they nevertheless have substantially increased grain size and substantially reduced grain separation as compared with a pentacene film deposited directly onto a conventional insulating substrate.

Figure 3:
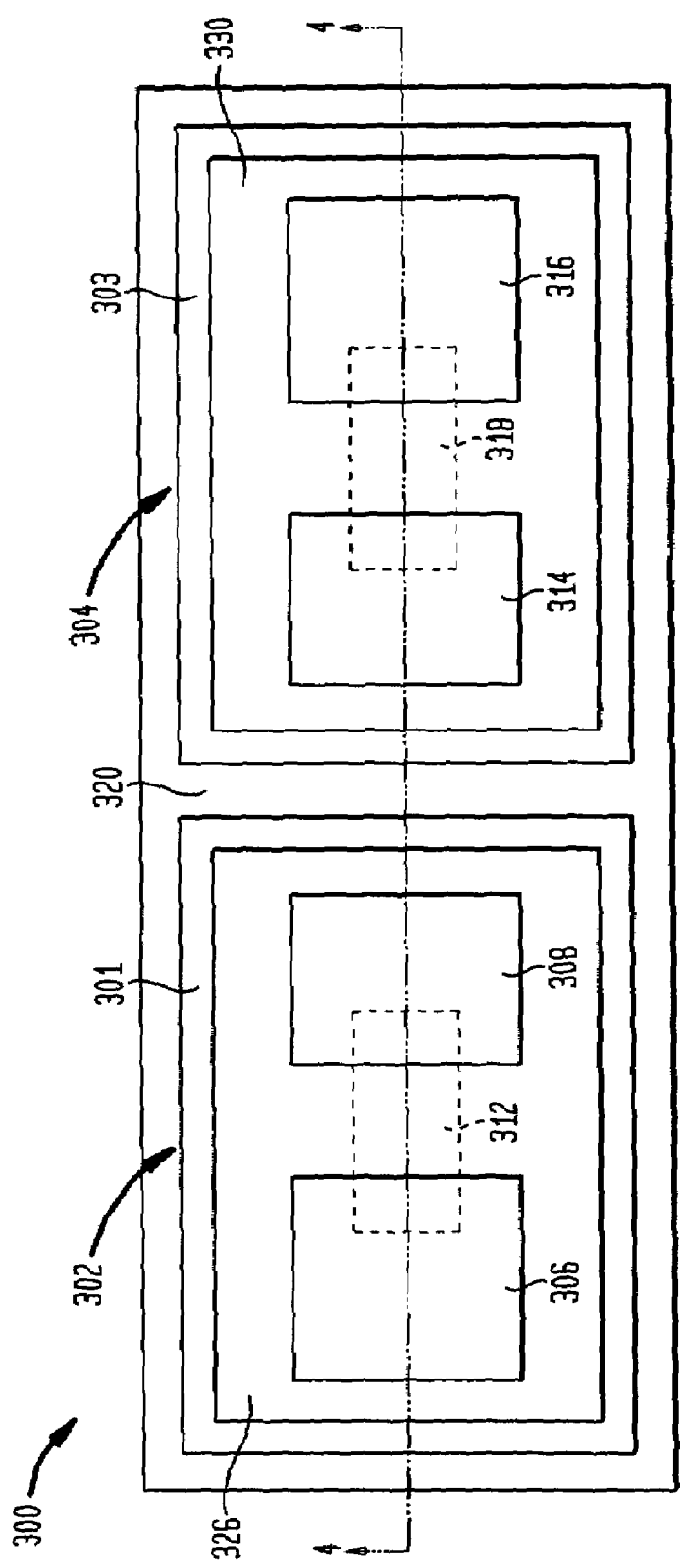
FIG. 3 shows another exemplary embodiment of two thin film transistors according to the present invention.

FIG. 3 shows another exemplary embodiment 300 according to the present invention, of two thin film transistors generally indicated at 302 and 304. Thin film transistor 302 comprises a source electrode 306 and a drain electrode 308 in a spaced apart arrangement overlying a semiconductor layer 310, the latter shown in FIG. 4 discussed below. The subsurface location of a gate electrode 312 for thin film transistor 302 under the semiconductor layer 310 is also shown. Thin film transistor 304 comprises a source electrode 314 and a drain electrode 316 in a spaced apart arrangement overlying the semiconductor layer 310. The subsurface location of a gate electrode 318 for thin film transistor 304 under the semiconductor layer 310 is also shown. The subsurface locations of gate dielectric regions 326 and 330 are shown, respectively extending throughout overlap regions 301 and 303. Thin film transistors 302 and 304 are further provided with low conductivity inducing layer 320, also extending throughout overlap regions 301 and 303. The subsurface location of low conductivity inducing layer 320 under the semiconductor layer 310 is shown to cover the surface area underlying the thin film transistors 302 and 304 except for those regions of such surface, beyond overlap regions 301 and 303, that are covered by the gate dielectric regions 326 and 330. Thus, the low conductivity inducing layer 320 overlaps throughout overlap regions 301 and 303 with the gate dielectric regions 326 and 330.

Figure 4:
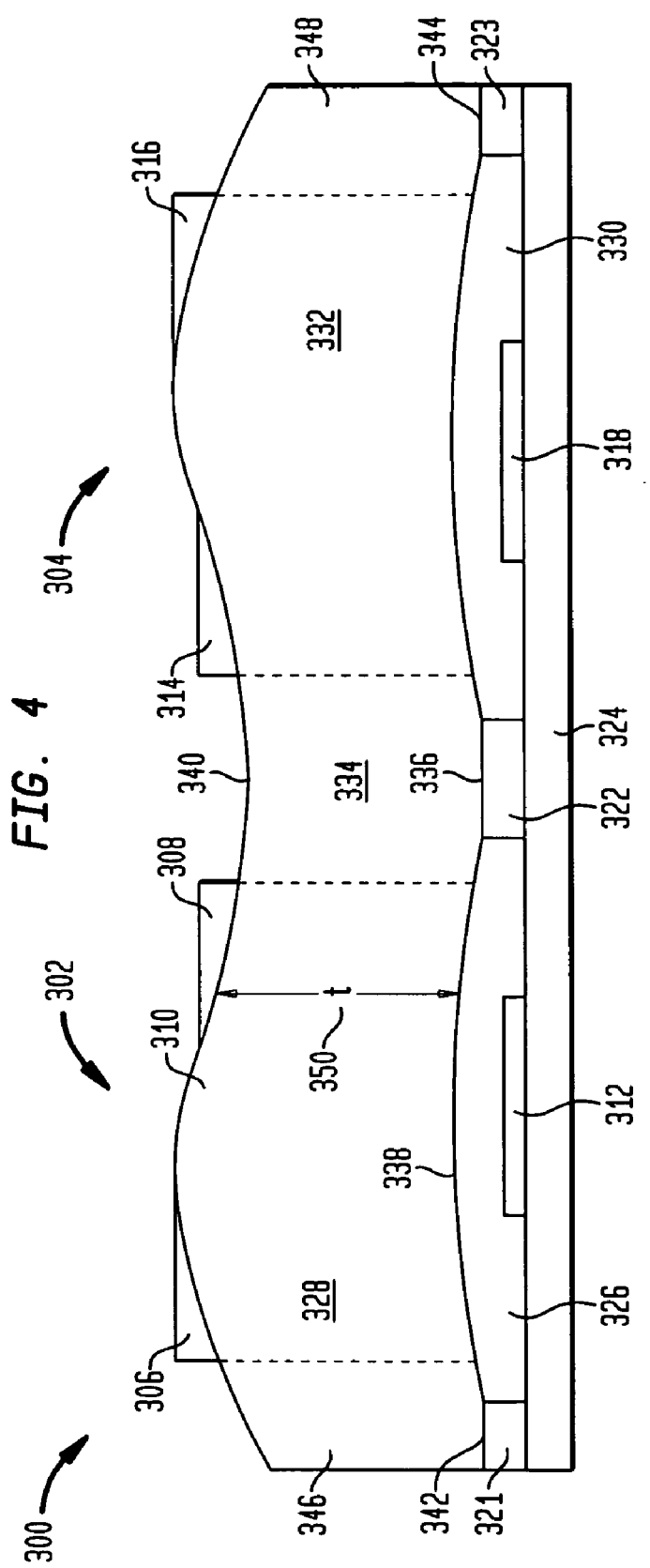
FIG. 4 shows a further view of the exemplary embodiment of two thin film transistors of FIG. 3.

FIG. 4 shows a further view of the thin film transistors 302 and 304, taken on line 4—4 in FIG. 3. The gate electrodes 312 and 318 overlie an insulating substrate 324 in a spaced apart arrangement. Low conductivity inducing layer regions 321, 322 and 323, collectively constituting low conductivity inducing layer 320 shown in FIG. 3, overlie and cover portions of the insulating substrate 324. A gate dielectric layer 326 overlies the insulating substrate 324 and covers the gate electrode 312 within the semiconductor region 328 over which the source electrode 306 and the drain electrode 308 of thin film transistor 302 are positioned. The locations of the low conductivity inducing layer regions 321 and 322 minimize any interpositioning of the low conductivity inducing layer 320 between the insulating substrate 324 and the semiconductor layer 310 within the semiconductor region 328. The locations of the low conductivity inducing layer regions 321 and 322 also maximize the interpositioning of the low conductivity inducing layer 320 between the insulating substrate 324 and the semiconductor layer 310 outside of the semiconductor region 328. A gate dielectric layer 330 overlies the insulating substrate 324 and covers the gate electrode 318 within the semiconductor region 332 over which the source electrode 314 and the drain electrode 316 of thin film transistor 304 are positioned. The locations of the low conductivity inducing layer regions 322 and 323 minimize any interpositioning of the low conductivity inducing layer 320 between the insulating substrate 324 and the semiconductor layer 310 within the semiconductor region 332. The locations of the low conductivity inducing layer regions 322 and 323 also maximize the interpositioning of the low conductivity inducing layer 320 between the insulating substrate 324 and the semiconductor layer 310 outside of the semiconductor region 332. The gate dielectric layers 326 and 330 as shown in FIG. 4 overlap with the low conductivity inducing layer regions 321, 322 and 323. Alternatively, the gate dielectric layers 326 and 330 can meet the edges of or not make contact with the low conductivity inducing layer regions 321, 322 and 323. In one exemplary embodiment according to the present invention, the gate dielectric layers 326 and 330 can be made barely large enough to effectively cover the gate electrodes 312 and 318. In another exemplary embodiment according to the present invention, the gate electrodes 312 and 318 are fabricated from a metal provided with an oxidized surface, and the gate dielectric layers 326 and 330 are omitted. For example, the gate electrodes 312 and 318 can be fabricated from aluminum, and the exposed surfaces are anodized to provide them with a dielectric coating. The semiconductor layer 310 overlies the insulating substrate 324, the low conductivity inducing layer regions 321, 322 and 323, and the gate dielectric layers 326 and 330. The source electrode 306 and drain electrode 308 of thin film transistor 302 overlie the semiconductor layer 310 in a spaced apart arrangement in alignment over the gate electrode 312. The source electrode 314 and drain electrode 316 of thin film transistor 304 overlie the semiconductor layer 310 in a spaced apart arrangement in alignment over the gate electrode 318. The source electrodes 306 and 314, drain electrodes 308 and 316, and the gate electrodes 312 and 318 are in communication with an electrical circuit, not shown, of which thin film transistors 302 and 304 form a part.

Referring to FIG. 4, regions 321, 322 and 323 of low conductivity inducing layer 320 are formed of dielectric materials that decrease the conductivity of the semiconductor layer 310 outside of the semiconductor regions 328 and 332 aligned over gate electrodes 312 and 318, 20 respectively. This decreased conductivity results from induced inhibition of crystalline grain growth in the semiconductor layer 310 except within the semiconductor regions 328 and 332. At a molecular level, the low conductivity inducing layer 320 is formed of a material having a structure or morphology that inhibits deposition of a crystalline lattice form, over large distances, of the selected semiconductor.

The decreased conductivity of the semiconductor layer 310 results in decreased transconductivity outside of the semiconductor regions 328 and 332. Hence, the semiconductor layer 310 is deposited over the low conductivity inducing layer 320 with a decreased degree of crystalline lattice order. The capability of the semiconductor layer 310 overlying regions 321, 322 and 323 of the low conductivity inducing layer 320 to transport charge carriers accordingly is reduced. Low conductivity inducing layer region 322, for example, is interposed between the insulating substrate 324 and a region 334 of the semiconductor layer 310 that is between the drain electrode 308 of thin film transistor 302 and the source electrode 314 of thin film transistor 304. The reduced capability of region 334 of the semiconductor layer 310 to transport charge carriers results in less crosstalk through the semiconductor layer 310 between thin film transistors 302 and 304. The capability of regions 346 and 348 of the semiconductor layer 310 to transport charge carriers is similarly reduced. The conductivity within regions 328 and 332 of the semiconductor layer 310 is relatively unaffected by the presence of low conductivity inducing layer region 320. Hence, the performance of the thin film transistors 302 and 304 is improved by reducing crosstalk, without decreasing the capacity of the thin film transistors 302 and 304 to transport charge carriers.

In one exemplary embodiment according to the present invention, the semiconductor layer 310 shown in FIGS. 3 and 4 is formed from pentacene and has a thickness t, indicated at 350, that is within a range of between about 20 pentacene molecules and about 30 pentacene molecules. Pentacene deposited at the interface 336 between low conductivity inducing layer region 322 and semiconductor layer 310 accordingly is induced to have decreased crystal grain size. Pentacene deposited at the exemplary interface 338 between gate dielectric layer 326 and semiconductor layer 310 within semiconductor region 328, however, is unaffected by the low conductivity inducing layer 320. Decreased crystal grain size at the exemplary interface 336 leads to decreased crystal grain size up through the thickness t of the semiconductor layer 310 in a direction toward the surface region 340. Decreased crystal grain size similarly occurs at interfaces 342 and 344.

Figure 5:
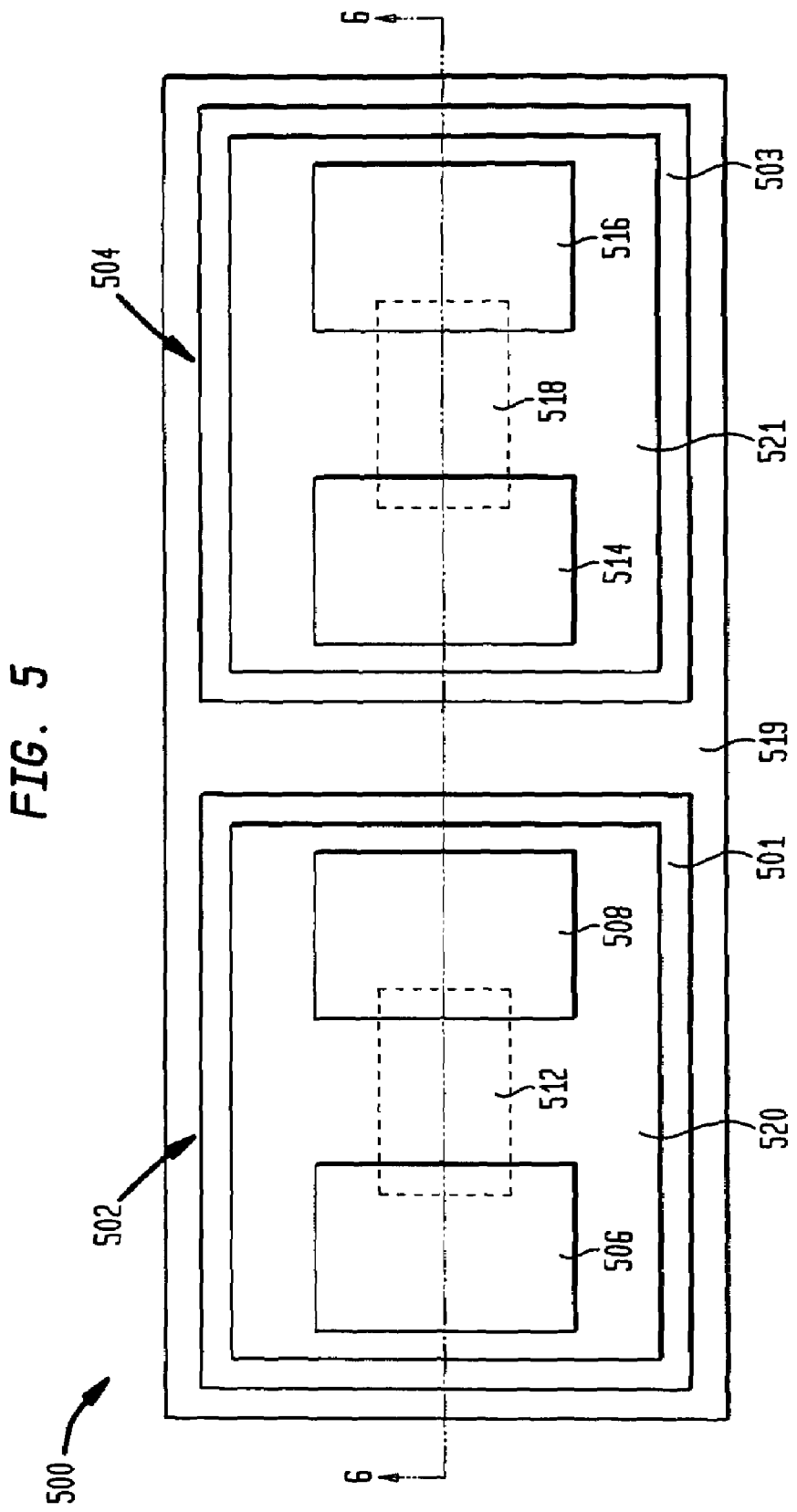
FIG. 5 shows an additional exemplary embodiment of two thin film transistors according to the present invention.

FIG. 5 shows an additional exemplary embodiment 500, according to the present invention, of two thin film transistors generally indicated at 502 and 504. Thin film transistor 502 comprises a source electrode 506 and a drain electrode 508 in a spaced apart arrangement overlying a semiconductor layer 510, the latter shown in FIG. 6 discussed below. The subsurface location of a gate electrode 512 for thin film transistor 502 under the semiconductor layer 510 is also shown. Thin film transistor 504 comprises a source electrode 514 and a drain electrode 516 in a spaced apart arrangement overlying the semiconductor layer 510. The subsurface location of a gate electrode 518 for thin film transistor 504 under the semiconductor layer 510 is also shown. Thin film transistors 502 and 504 are further provided with high conductivity inducing layer regions 520 and 521 respectively extending throughout overlap regions 501 and 503. A low conductivity inducing layer 519 is provided, also extending throughout overlap regions 501 and 503. The low conductivity inducing layer 519 covers the surface of the insulating substrate 525 shown in FIG. 6 as discussed immediately below except for those regions of the insulating substrate 525, beyond overlap regions 501 and 503, that are covered by the high conductivity inducing layer regions 520 and 521. Thus, the low conductivity inducing layer 519 overlaps throughout overlap regions 501 and 503 with the high conductivity inducing layer regions 520 and 521.

Figure 6:
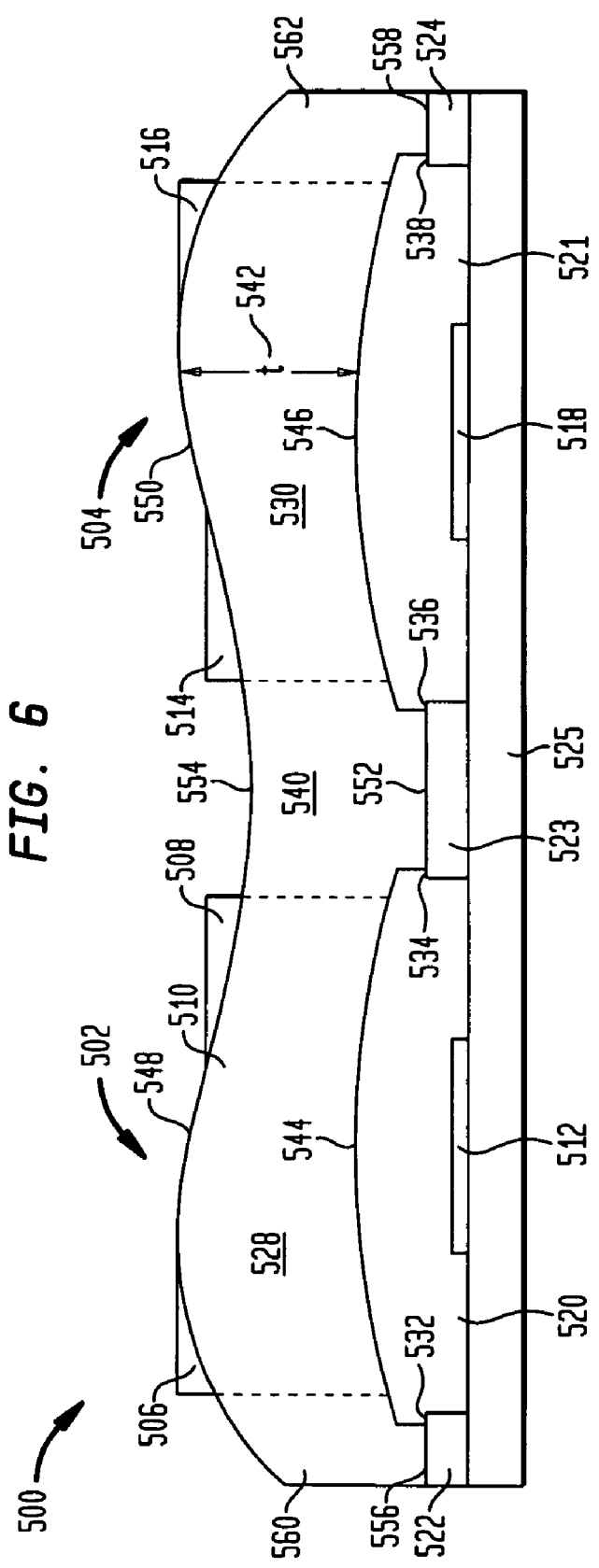
FIG. 6 shows a further view of the exemplary embodiment of two thin film transistors of FIG. 5.

FIG. 6 shows a further view of the exemplary embodiment 500 according to the present invention of thin film transistors 502 and 504, taken on line 6—6 in FIG. 5. The gate electrodes 512 and 518 overlie an insulating substrate 525 in a spaced apart arrangement. High conductivity inducing layer regions 520 and 521 overlie the insulating substrate 525, and are aligned with and cover gate electrodes 512 and 518, respectively. Low conductivity inducing layer regions 522, 523 and 524, collectively constituting low conductivity inducing layer 519 shown in FIG. 5, also overlie and cover portions of the insulating substrate 525. The locations of the low conductivity inducing layer regions 522 and 523 minimize any interpositioning of the low conductivity inducing layer 519 between the insulating substrate 525 and the semiconductor layer 510 within the semiconductor region 528. The locations of the low conductivity inducing layer regions 523 and 524 minimize any interpositioning of the low conductivity inducing layer 519 between the insulating substrate 525 and the semiconductor layer 510 within the semiconductor region 530. The locations of the low conductivity inducing layer regions 522, 523 and 524 also maximize the interpositioning of the low conductivity inducing layer 519 between the insulating substrate 525 and the semiconductor layer 510 outside of the semiconductor regions 528 and 530. In the exemplary embodiment shown in FIGS. 5 and 6, the high conductivity inducing layer regions 520 and 521 partially overlap the low conductivity inducing layer 519 at points 532, 534, 536 and 538. In another embodiment according to the present invention, such overlapping is omitted. The semiconductor layer 510 overlies the insulating substrate 525, the low conductivity inducing layer regions 522, 523 and 524, and the high conductivity inducing layer regions 520 and 521. The source electrode 506 and drain electrode 508 of thin film transistor 502 overlie the semiconductor layer 510 in a spaced apart arrangement in alignment over the gate electrode 512. The source electrode 514 and drain electrode 516 of thin film transistor 504 overlie the semiconductor layer 510 in a spaced apart arrangement in alignment over the gate electrode 518. The source electrodes 506 and 514, drain electrodes 508 and 516, and the gate electrodes 512 and 518 are in communication with an electrical circuit, not shown, of which thin film transistors 502 and 504 form a part.

The high conductivity inducing layer regions 520 and 521 are formed of dielectric materials that increase the conductivity of the semiconductor layer 510 in the semiconductor regions 528 and 530, respectively. The resulting enhanced transconductivity increases the capacity of the thin film transistors 502 and 504 to transport charge carriers, thus directly improving the performance of such thin film transistors 502 and 504. Regions 522, 523 and 524 of low conductivity inducing layer 519 are formed of dielectric materials that decrease the conductivity of the semiconductor layer 510 outside of the semiconductor regions 528 and 530. The resulting decreased conductivity of the semiconductor layer 510 results in decreased transconductivity outside of the semiconductor regions 528 and 530. The capability of the semiconductor layer 510 overlying regions 522, 523 and 524 of the low conductivity inducing layer 519 to transport charge carriers accordingly is reduced. Low conductivity inducing layer region 523, for example, is interposed between the insulating substrate 525 and a region 540 of the semiconductor layer 510 that is between the drain electrode 508 of thin film transistor 502 and the source electrode 514 of thin film transistor 504. The reduced capability of region 540 of the semiconductor layer 510 to transport charge carriers results in less crosstalk through the semiconductor layer 510 between thin film transistors 502 and 504. Hence, the performance of the thin film transistors 502 and 504 is improved both by reducing crosstalk and by increasing the capacity of the thin film transistors 502 and 504 to transport charge carriers.

In one exemplary embodiment according to the present invention, the semiconductor layer 510 shown in FIGS. 5 and 6 is formed from pentacene and has a thickness t, indicated at 542, that is within a range of between about 10 pentacene molecules and about 20 pentacene molecules. Pentacene deposited at the interface 544 between high conductivity inducing layer region 520 and semiconductor layer 510 accordingly is induced to have increased crystal grain size. Similarly, pentacene deposited at the interface 546 between high conductivity inducing layer region 521 and semiconductor layer 510 accordingly is induced to have increased crystal grain size. Increased crystal grain size at the interfaces 544 and 546 leads to increased crystal grain size, although to a lesser degree, up through the thickness t of the semiconductor layer 510 in a direction toward the surface regions 548 and 550, respectively. Pentacene deposited at the interface 552 between low conductivity inducing layer region 523 and semiconductor layer 510 in contrast, is induced to have decreased crystal grain size. Decreased crystal grain growth at the exemplary interface 552 leads to decreased crystal grain size up through the thickness t of the semiconductor layer 510 in a direction toward the surface region 554. Decreased crystal grain growth similarly occurs at interfaces 556 and 558.

Figure 7:
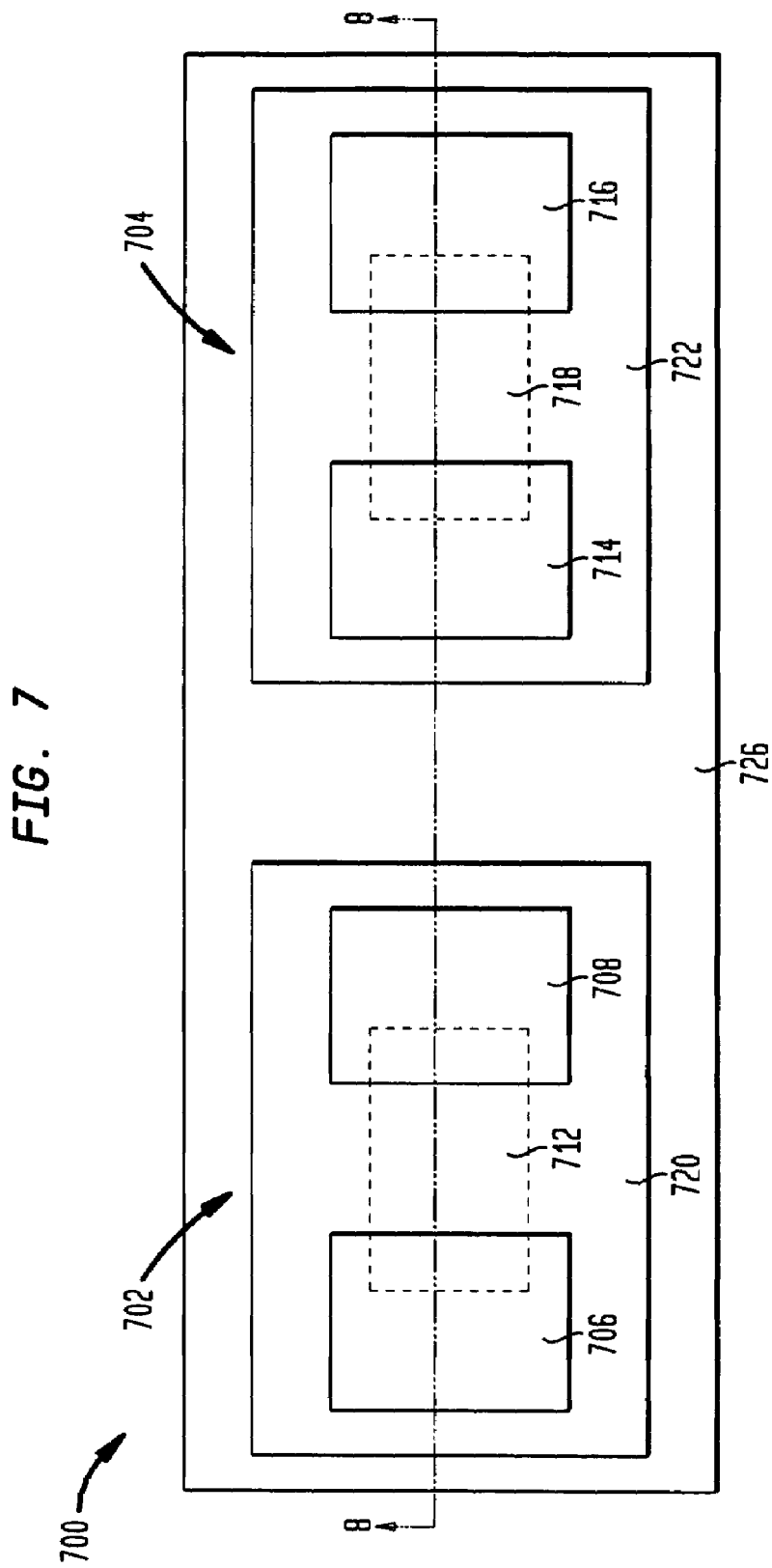
FIG. 7 shows a further exemplary embodiment of two thin film transistors according to the present invention.

FIG. 7 shows a further exemplary embodiment 700, according to the present invention, of two thin film transistors generally indicated at 702 and 704. Thin film transistor 702 comprises a source electrode 706 and a drain electrode 708 in a spaced apart arrangement overlying a semiconductor layer 710, shown in FIG. 8 discussed immediately below. The subsurface location of a gate electrode 712 for thin film transistor 702 under the semiconductor layer 710 is also shown. Thin film transistor 704 comprises a source electrode 714 and a drain electrode 716 in a spaced apart arrangement overlying the semiconductor layer 710. The subsurface location of a gate electrode 718 for thin film transistor 704 under the semiconductor layer 710 is also shown. Thin film transistors 702 and 704 are further provided with high conductivity inducing layer regions 720 and 722 respectively, the subsurface locations of which under the semiconductor layer 710 are shown. Low conductivity inducing layer 726 underlies the high conductivity inducing layer regions 720 and 722 and covers the entire surface of the insulating substrate 724 shown in FIG. 6.

Figure 8:
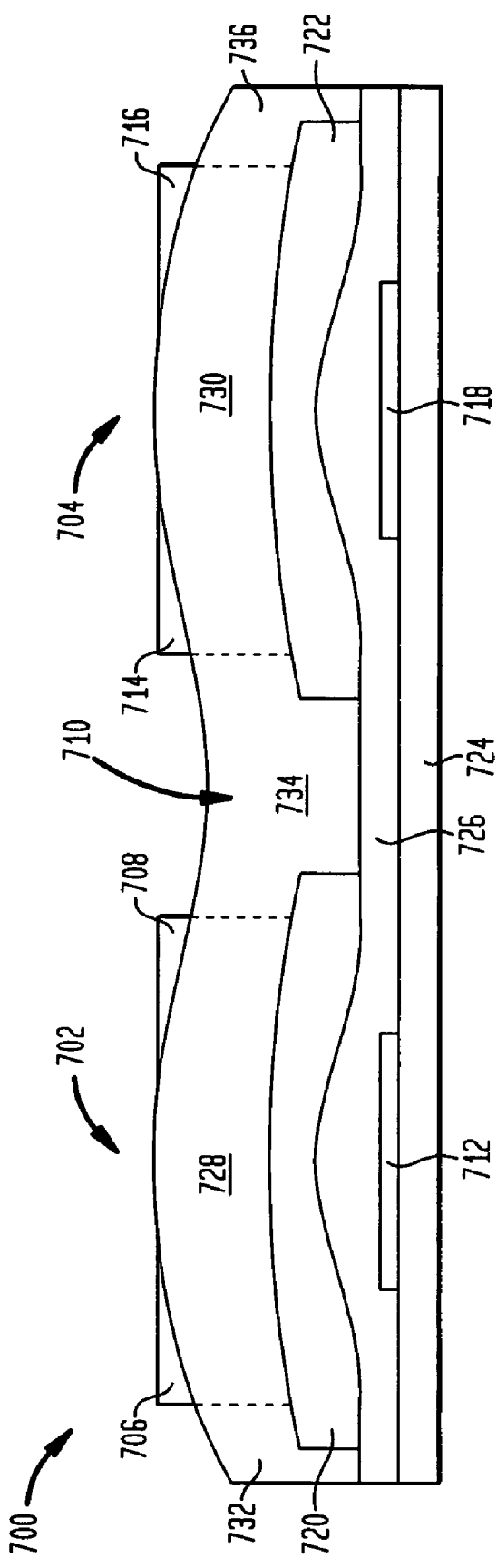
FIG. 8 shows a further view of the exemplary embodiment of two thin film transistors of FIG. 7.

FIG. 8 shows a further view of the exemplary embodiment 700 according to the present invention of thin film transistors 702 and 704, taken on line 8—8 in FIG. 7. The gate electrodes 712 and 718 overlie an insulating substrate 724 in a spaced apart arrangement. Low conductivity inducing layer 726 overlies the insulating substrate 724 and covers gate electrodes 712 and 718. High conductivity inducing layer regions 720 and 722 are interposed between the low conductivity inducing layer 726 and the semiconductor layer 710, and are aligned with gate electrodes 712 and 718, respectively. The semiconductor layer 710 overlies the low conductivity inducing layer 726 and the high conductivity inducing layer regions 720 and 722. The source electrode 706 and drain electrode 708 of thin film transistor 702 overlie the semiconductor layer 710 in a spaced apart arrangement in alignment over the gate electrode 712. The source electrode 714 and drain electrode 716 of thin film transistor 704 overlie the semiconductor layer 710 in a spaced apart arrangement in alignment over the gate electrode 718. The source electrodes 706 and 714, drain electrodes 708 and 716, and the gate electrodes 712 and 718 are in communication with an electrical circuit, not shown, of which thin film transistors 702 and 704 form a part.

The high conductivity inducing layer regions 720 and 722 are formed of dielectric materials that increase the conductivity of the semiconductor layer 710 in the semiconductor regions 728 and 730, respectively. The resulting enhanced transconductivity increases the capacity of the thin film transistors 702 and 704 to transport charge carriers, thus directly improving the performance of such thin film transistors 702 and 704. Low conductivity inducing layer 726 makes contact with regions 732, 734 and 736 of semiconductor layer 710. Regions 728 and 730 of the semiconductor layer 710 are protected from such contact by the interposed high conductivity inducing layer regions 720 and 722. Low conductivity inducing layer 726 can be a continuous layer overlying the insulating substrate 724 and covering the gate electrodes 712 and 718, potentially providing added flexibility in fabrication procedures. The low conductivity inducing layer 726 is formed of dielectric materials that decrease the conductivity of the semiconductor layer 710 in regions 732, 734 and 736. The resulting decreased conductivity of the semiconductor layer 710 results in decreased transconductivity in regions 732, 734 and 736 of semiconductor layer 710. The capability of regions 732, 734 and 736 of the semiconductor layer 710 to transport charge carriers accordingly is reduced. Hence, the performance of the thin film transistors 702 and 704 is improved both by reducing crosstalk and by increasing the capacity of the thin film transistors 702 and 704 to transport charge carriers.

Figure 9:
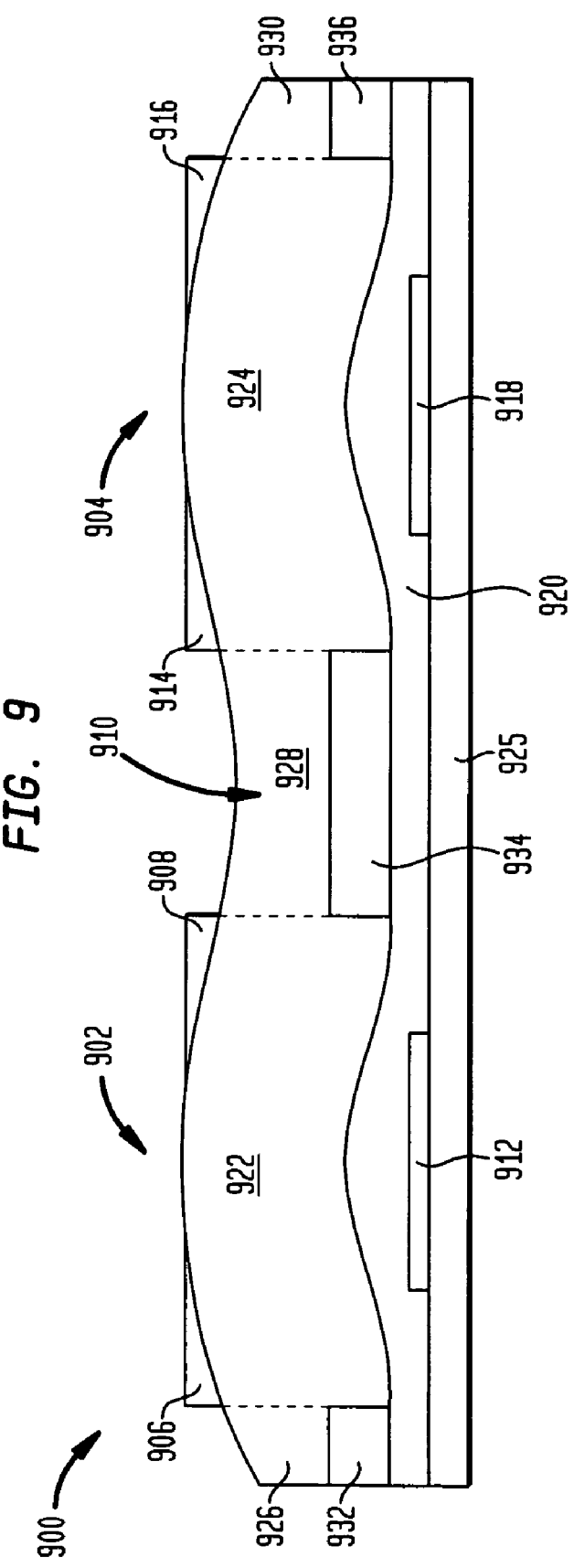
FIG. 9 shows a further exemplary embodiment according to the present invention of two thin film transistors.

FIG. 9 shows a further exemplary embodiment 900, according to the present invention, of two thin film transistors generally indicated at 902 and 904. Thin film transistor 902 comprises a source electrode 906 and a drain electrode 908 in a spaced apart arrangement overlying a semiconductor layer 910. Thin film transistor 904 comprises a source electrode 914 and a drain electrode 916 in a spaced apart arrangement overlying the semiconductor layer 910. Gate electrode 912 overlies an insulating substrate 925 and is in alignment with a midpoint between source electrode 906 and drain electrode 908 of thin film transistor 902. Gate electrode 918 overlies the insulating substrate 925 and is in alignment with a midpoint between source electrode 914 and drain electrode 918 of thin film transistor 904. High conductivity inducing layer 920 overlies the insulating substrate 925 and covers gate electrodes 912 and 918. The semiconductor layer 910 overlies high conductivity inducing layer 920. The source electrode 906 and the drain electrode 908 of thin film transistor 902 overlie region 922 of the semiconductor layer 910, centered over gate electrode 912. Region 922 of the semiconductor layer 910 is in direct contact with the high conductivity inducing layer 920. The source electrode 914 and the drain electrode 916 of thin film transistor 904 overlie region 924 of the semiconductor layer 910, centered over gate electrode 918. Region 924 of the semiconductor layer 910 is also in direct contact with the high conductivity inducing layer 920. Regions 922 and 924 of the semiconductor layer are interposed by regions 926, 928 and 930 of the semiconductor layer 910. Low conductivity inducing layer regions 932, 934 and 936 are interposed between the high conductivity inducing layer 920 and regions 926, 928 and 930 of the semiconductor layer 910, respectively. The locations of the low conductivity inducing layer regions 932 and 934 minimize any interpositioning of the low conductivity inducing layer between the high conductivity inducing layer 920 and the semiconductor layer 910 within the high conductivity semiconductor region 922. The locations of the low conductivity inducing layer regions 934 and 936 minimize any interpositioning of the low conductivity inducing layer between the high conductivity inducing layer 920 and the semiconductor layer 910 within the high conductivity semiconductor region 924. The locations of the low conductivity inducing layer regions 932, 934 and 936 also maximize the interpositioning of the low conductivity inducing layer between the high conductivity inducing layer 920 and the semiconductor layer 910 outside of the high conductivity semiconductor regions 922 and 924. The source electrodes 906 and 914, drain electrodes 908 and 916, and the gate electrodes 912 and 918 are in communication with an electrical circuit, not shown, of which thin film transistors 902 and 904 form a part.

The high conductivity inducing layer 920 makes direct contact with regions 922 and 924 of semiconductor layer 910. The high conductivity inducing layer 920 is formed of dielectric materials that increase the conductivity of the semiconductor layer 910 in regions 922 and 924. The resulting increased conductivity of the semiconductor layer 910 results in increased transconductivity in regions 922 and 924 of semiconductor layer 910. High conductivity inducing layer 920 can be a continuous layer overlying the insulating substrate 925 and covering the gate electrodes 912 and 918, potentially providing added flexibility in fabrication procedures. The low conductivity inducing layer regions 932, 934 and 936 are formed of dielectric materials that decrease the conductivity of the semiconductor layer 910 in the low conductivity semiconductor regions 926, 928 and 930, respectively. The resulting decreased conductivity of the semiconductor layer 910 results in decreased transconductivity outside of the semiconductor regions 922 and 924. The capability of the semiconductor layer 910 in the low conductivity semiconductor regions 926, 928 and 930 to transport charge carriers accordingly is reduced. Low conductivity semiconductor region 928, for example, is located between the drain electrode 908 of thin film transistor 902 and the source electrode 914 of thin film transistor 904. Hence, the performance of the thin film transistors 902 and 904 is improved both by reducing crosstalk and by increasing the capacity of the thin film transistors 902 and 904 to transport charge carriers.

Figure 10:
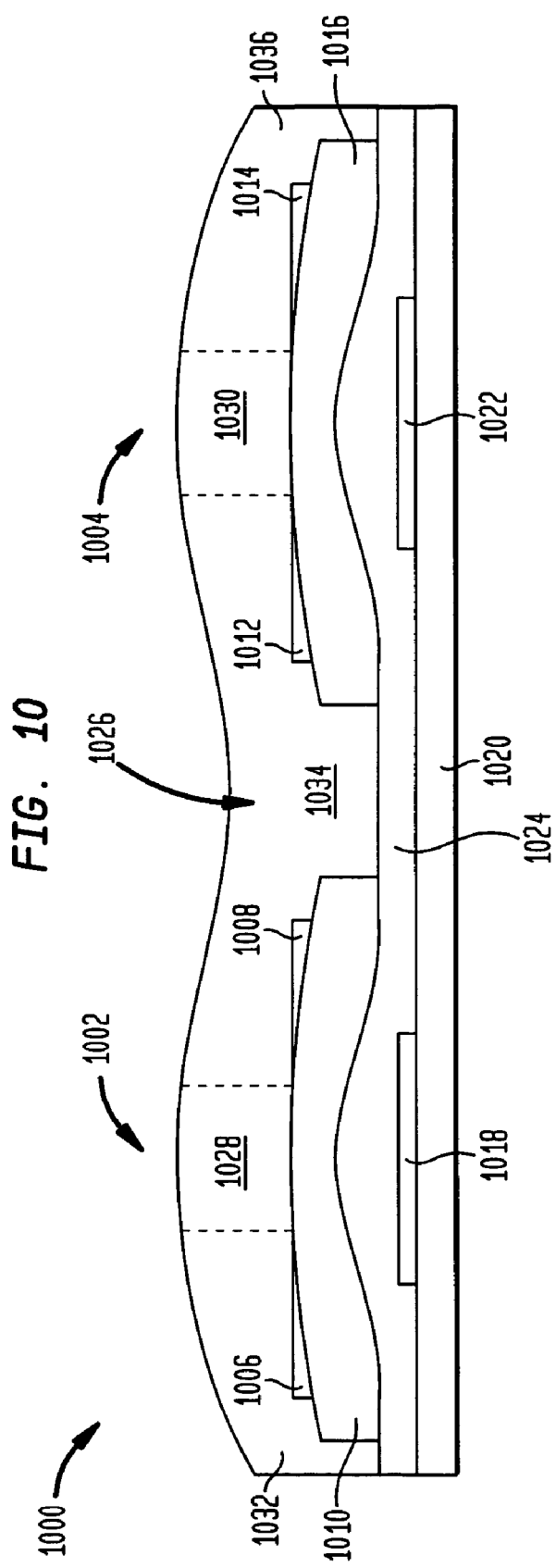
FIG. 10 shows a further view of the exemplary embodiment of two thin film transistors of FIG. 9.

FIG. 10 shows a further exemplary embodiment 1000, according to the present invention, of two thin film transistors generally indicated at 1002 and 1004. Thin film transistor 1002 comprises a source electrode 1006 and a drain electrode 1008 in a spaced apart arrangement overlying a high conductivity semiconductor region 1010. Thin film transistor 1004 comprises a source electrode 1012 and a drain electrode 1014 in a spaced apart arrangement overlying a high conductivity semiconductor region 1016. A gate electrode 1018 overlies an insulating substrate 1020 and is in alignment with a midpoint between source electrode 1006 and drain electrode 1008 of thin film transistor 1002. A gate electrode 1022 overlies the insulating substrate 1020 and is in alignment with a midpoint between source electrode 1012 and drain electrode 1014 of thin film transistor 1004. Low conductivity inducing layer 1024 overlies the insulating substrate 1020 and covers gate electrodes 1018 and 1022. The high conductivity inducing layer region 1010 overlies the low conductivity inducing layer 1024 and is centered over gate electrode 1018. The high conductivity inducing layer region 1016 overlies the low conductivity inducing layer 1024 and is centered over gate electrode 1022. A semiconductor layer 1026 overlies the low conductivity inducing layer 1024, the high conductivity inducing layer regions 1010 and 1016, the source electrodes 1006 and 1012, and the drain electrodes 1008 and 1014. The high conductivity inducing layer regions 1010 and 1016 are in direct contact with high conductivity regions 1028 and 1030 of the semiconductor layer 1026, respectively. The low conductivity inducing layer 1024 is in direct contact with the semiconductor layer 1026 in low conductivity semiconductor regions 1032, 1034 and 1036. The high conductivity inducing layer regions 1010 and 1016 are formed of dielectric materials that increase the conductivity of the semiconductor layer 1010 in regions 1028 and 1030, respectively. The low conductivity inducing layer 1024 is formed of dielectric materials that decrease the conductivity of the semiconductor layer 1010 in the low conductivity semiconductor regions 1032, 1034 and 1036, respectively. The source electrodes 1006 and 1008, drain electrodes 1012 and 1014, and the gate electrodes 1018 and 1022 are in communication with an electrical circuit, not shown, of which thin film transistors 1002 and 1004 form a part.

FIGS. 1–10 as discussed above relate to exemplary and non limiting embodiments according to the present invention. For example, the embodiments shown in FIGS. 1–10 all show two thin film transistors. Other embodiments according to the present invention can comprise any desired quantity of thin film transistors. For example, the thin film transistors can be incorporated into an integrated circuit. Other suitable designs for thin film transistors can be employed. For example, in one exemplary further thin film transistor design according to the present invention, a high conductivity inducing layer is positioned to increase the conductivity of a semiconductor region that is in contact with the source and drain electrodes of a thin film transistor. In another exemplary further thin film transistor design according to the present invention, a low conductivity inducing layer is positioned to decrease the conductivity of a semiconductor region adjacent to a semiconductor region that is in contact with the source and drain electrodes of a thin film transistor. In an additional exemplary further thin film transistor design according to the present invention, a low conductivity inducing layer is positioned to decrease the conductivity of a semiconductor region that is interposed between semiconductor regions that are in contact with the source and drain electrodes of a plurality of thin film transistors. In another exemplary further thin film transistor design according to the present invention, a high conductivity inducing layer is positioned to increase the conductivity of a semiconductor region that is in contact with the source and drain electrodes of a thin film transistor, and a low conductivity inducing layer is positioned to decrease the conductivity of a semiconductor region adjacent to the semiconductor region that is in contact with the source and drain electrodes of a thin film transistor.

The embodiments shown in FIGS. 1–10 and discussed above are all field effect transistors each employing a single semiconductor layer. Other field effect transistor designs comprising two semiconductor layers, for example, can also be employed. For example, metal oxide semiconductor field effect transistor (MOSFET) designs, and junction field effect transistor (JFET) designs can be employed.

Further embodiments according to the invention will be discussed below in connection with thin film transistors. However, it is to be understood that the teachings according to the present invention can be further extended to devices other than thin film transistors that require lateral patterning of a semiconductor film or layer into regions of relatively high and low conductivity. For example, diodes can be produced in an analogous manner. Other exemplary semiconductor electronic devices that can be fabricated by use of the teachings according to the present invention include light emitting devices, photodetecting devices, photovoltaic cells, photoconductive cells, photoresistive cells, photodiodes, and photoswitches.

Appropriate materials for forming high and low conductivity inducing layers to be employed in making thin film transistors according to the present invention are selected depending upon the composition of the semiconductor to be employed. Materials for forming high conductivity inducing layers are selected that encourage crystal grain growth in an adjacent layer of the semiconductor. Materials for forming low conductivity inducing layers are selected that impede and reduce crystal grain size in an adjacent layer of the semiconductor. Where materials for forming high and low conductivity inducing layers are both employed, the affinity of the chosen semiconductor for such respective materials may be uniform or different as desired. Affinity is a measure of the ability of two materials to bind together, and does not affect crystal grain growth.

In one embodiment according to the present invention, the selected semiconductor is pentacene. Pentacene, an organic compound, is a linear acene having five rings. Films of pentacene are capable of transconductive transport of holes. Pentacene has the highest mobility among the linear acenes. Although the mobility of pentacene in polycrystalline organic thin films is within a low range between about $0.3 \times 10^{-7}$ cm$^2$/Vs and about $1.5 \times 10^{-5}$ cm$^2$/Vs at room temperature, the mobility of pentacene in monocrystalline organic thin films is within a high range between about 1 cm$^2$/Vs and about 5 cm$^2$/Vs. In another embodiment according to the present invention, another linear or nonlinear acene is substituted for pentacene.

Suitable polymers for making layers for use in contact with portions of an organic semiconductor layer comprising pentacene to induce high transconductivity include, for example, poly(para-vinyl phenol), poly(4-vinylpyridine), and poly(2-vinylnaphthalene). Poly(para-vinyl phenol) is also known as poly(hydroxystyrene). Poly(meta-vinyl phenol) or poly(ortho-vinyl phenol) may also be effective. Alternatively, poly(para-vinyl phenol-co-2-hydroxyethylmethacrylate) can be employed. In addition to poly(4-vinylpyridine), poly(2-vinylpyridine) may also be effective. In addition to poly(2-vinylnaphthalene), poly(2-vinylnaphthalene-co-2-ethylhexyl acrylate) can be used. In addition to poly(2-vinylnaphthalene), poly(1-vinylnaphthalene) may also be effective. Blends of these polymers, and of other suitable polymers, if available, can also be used. The term "blends" as used in this specification broadly encompasses and includes copolymers formed from the corresponding monomers or oligomers, mixtures of polymers, and other compositions comprising the monomers, however produced.

Suitable polymers for making layers for use in contact with portions of an organic semiconductor layer comprising pentacene to induce low transconductivity include, for example, poly(n-butyl methacrylate), poly(vinylidene difluoride-co-methyl vinyl ether), polystyrene, poly(p-methoxystyrene), poly(vinylidene difluoride), poly(vinyl acetate), poly(vinyl propionate) and poly(methoxy acetate). In one embodiment according to the present invention, poly(vinylidene difluoride-co-methyl vinyl ether) comprising about 85% by weight of vinylidene difluoride and about 15% by weight of methyl vinyl ether, having a dielectric constant of about 10, is employed. In addition to poly(n-butyl methacrylate), a polymer such as poly(n-propyl methacrylate), poly(isopropyl methacrylate), or poly(n-pentyl methacrylate) may also be effective. Acrylates, ethacrylates, and halogenated analogs of poly(n-butyl methacrylate) may further be effective. In addition to poly(vinylidene difluoride-co-methyl vinyl ether), a polymer such as poly(vinylidene difluoride-co-ethyl vinyl ether) or poly(vinylidene difluoride-co-propyl vinyl ether) may be effective. Blends of these polymers, blends being broadly defined as above, and of other suitable polymers, if available, can also be used.

In another embodiment according to the present invention, a polymer for making layers to be placed in contact with portions of an organic semiconductor layer comprising pentacene to induce low transconductivity is selected for its high content of charge carrier traps. Such a polymer, when interposed between selected regions of a substrate surface and an overlying semiconductor layer, effectively reduces the conductivity of those portions of the semiconductor layer overlying the selected regions. For example, poly(dimethylaminoethyl methacrylate), poly(dimethylaminopropyl methacrylate), poly(aminopropyl methacrylate) and poly(diethylaminoethyl methacrylate) can be so used. Each of these polymers has a high concentration of amino groups and a glass transition temperature approximating that of poly(n-butyl methacrylate). The polymers discussed above for making layers that induce high and low conductivity in films comprising pentacene are commercially available from the Sigma-Aldrich Chemical Company, St. Louis, Mo.

Figure 11:
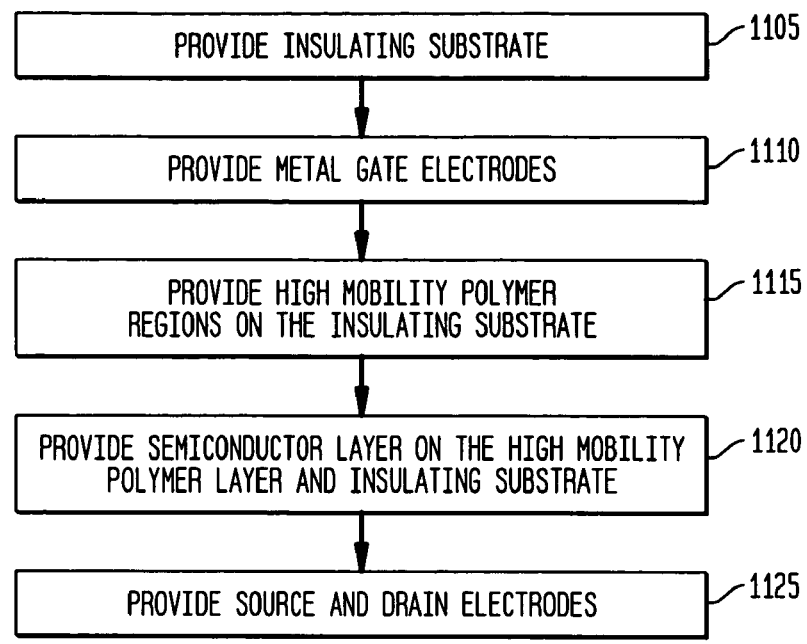
FIG. 11 shows an exemplary method according to the present invention of making the transistors shown in FIGS. 1 and 2.

In one embodiment according to the present invention, thin film transistors 102 and 104 shown in FIGS. 1 and 2 having pentacene semiconductor layer 110 are fabricated by an exemplary method 1100 shown in FIG. 11. Referring to FIG. 11, a silicon dioxide glass slide having a rough surface to inhibit pentacene crystallization is provided at step 1105 to serve as the insulating substrate 124. The rough surface can be provided, for example, by subjecting a silicon dioxide slide to a basic etch or to abrasion by sandpaper. A surface of the insulating substrate 124 on which semiconductor layer 110 and high conductivity inducing regions 120 and 122 will be provided, is thoroughly cleaned. For example, the surface of the insulating substrate 124 can be treated by sonication while being immersed in a soap solution, rinsed in a volatile solvent such as methanol or acetone, blown dry by nitrogen, and then subjected to an oxygen plasma.

At step 1110, gate electrodes 112 and 118 are provided on the insulating substrate 124. For example, a steel shadow mask can be placed over the surface of the insulating substrate 124, leaving exposed those portions of the surface where gate electrodes 112 and 118 are to be located. The insulating substrate 124 is then placed in a suitable vacuum chamber such as a bell jar, which is then evacuated. A source of aluminum metal is also placed in the vacuum chamber and heated to vaporize and deposit aluminum over the shadow mask to produce the gate electrodes 112 and 118. Other suitable materials for fabricating gate electrodes can be substituted for aluminum. For example, gold, silver, gallium, indium, platinum, nickel, titanium, copper, or conductive ceramics such as indium tin oxide can be used. Any metal that can be evaporated or sputtered can be used for the gate.

At step 1115, high conductivity inducing layer regions 120 and 122 are provided on the insulating substrate 124, centered over the gate electrodes 112 and 118, respectively. A suitable solution of a high conductivity inducing polymer is needed, as the high conductivity inducing polymers discussed above generally are commercially provided in a powder form. For example, a selected polymer such as poly(4-vinylpyridine) is suitably purified, such as by reprecipitation or chromatography, and dissolved in a suitable solvent. A solution comprising between about 5% and about 10% of poly(4-vinylpyridine) in methyl ethyl ketone, for example, can be prepared. The polymer solution can, for example, be applied to the insulating substrate 124 by a spin coating process. A poly(4-vinylpyridine) film is spin coated on the insulating substrate 124, having a thickness, for example, of about one micron. The film of poly(4-vinylpyridine) is then removed from the insulating substrate 124 except for portions to constitute the high conductivity inducing layer regions 120 and 122, for example by a wiping the polymer away with a swab dipped in methyl ethyl ketone. The gate electrodes 112 and 118 are then exposed by the same wiping process.

In another embodiment according to the present invention, a lamination process is substituted for the spin coating process in order to deposit the high conductivity inducing polymer in step 1115. Suitable lamination processes for this purpose are disclosed in U.S. patent application Ser. No. 10/949,632, which claimed priority to Provisional U.S. patent application Ser. No. 60/505,880 filed concurrently herewith and entitled "Process for Laminating a Dielectric Layer onto a Semiconductor," the former of which issued on Jan. 24, 2006 as U.S. Pat. No. 6,989,336. This patent is assigned to E. I. du Pont de Nemours and Company, and is hereby incorporated herein by reference in its entirety. It is to be understood that such lamination processes can be used in substitution for spin coating processes in all of the instances where spin coating is discussed in this specification.

At step 1120, a layer 110 of pentacene is provided on the high conductivity inducing layer regions 120 and 122, and on the exposed portions of the insulating substrate 124. The pentacene is applied by a process that is suitable to allow the high conductivity inducing layer regions 120 and 122 to affect the crystallinity of the applied pentacene. For example, pentacene can be applied onto the high conductivity inducing layer regions 120 and 122 by employing a vacuum sublimation process. The insulating substrate 124 having the high conductivity inducing layer regions 120 and 122 is placed in a suitable vacuum chamber such as a bell jar, which is then evacuated. A source of pentacene is also placed in the vacuum chamber and heated to sublimate the pentacene and deposit a pentacene layer 110 over the high conductivity inducing layer regions 120 and 122 and over the exposed portions of the insulating substrate 124. High conductivity regions 126 and 128 are thus generated within the pentacene layer 110.

At step 1125, source electrodes 106 and 114, and drain electrodes 108 and 116, are provided on the semiconductor layer 110 in alignment over the high conductivity inducing layer regions 120 and 122. For example, a steel shadow mask can be placed over the surface of the semiconductor layer 110, leaving exposed those portions of the surface where the source electrodes 106 and 114 and the drain electrodes 108 and 116 are to be located. The insulating substrate 124 is then placed in a suitable vacuum chamber such as a bell jar, which is then evacuated. A source of gold metal is also placed in the vacuum chamber and heated to vaporize and deposit gold over the shadow mask to produce the source electrodes 106 and 114 and the drain electrodes 108 and 116.

Figure 12:
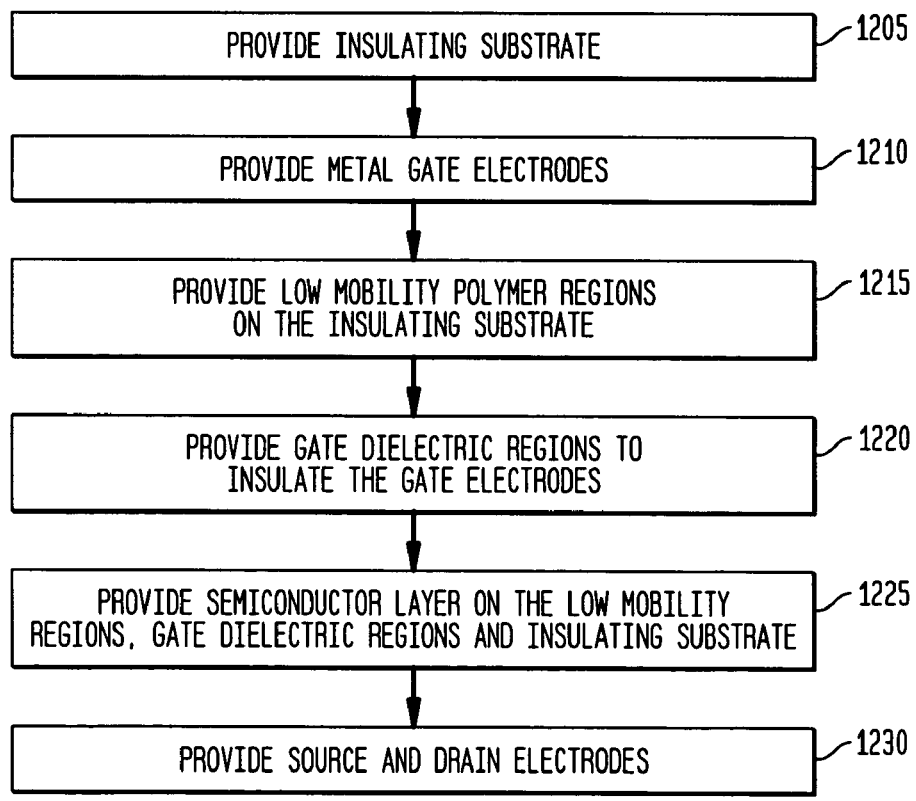
FIG. 12 shows an exemplary method according to the present invention of making the transistors shown in FIGS. 3 and 4.

In another embodiment according to the present invention, thin film transistors 302 and 304 shown in FIGS. 3 and 4 having pentacene layer 310 are fabricated by an exemplary method 1200 shown in FIG. 12. Referring to FIG. 12, a silicon dioxide glass slide having a rough surface to inhibit pentacene crystallization is provided at step 1205 to serve as the insulating substrate 324. A surface of the insulating substrate 324 on which low conductivity inducing layer regions 321, 322 and 323 as well as gate dielectric regions 326 and 330 will be provided, is thoroughly cleaned. The surface of the insulating substrate 324 can be cleaned in the same manner as discussed above in connection with FIG. 11.

At step 1210, gate electrodes 312 and 318 are provided on the insulating substrate 324 in the same manner as discussed above in connection with FIG. 11.

At step 1215, low conductivity inducing polymer layer regions 321, 322 and 323 are provided on the insulating substrate. A suitable solution of a low conductivity inducing polymer is needed, as the low conductivity inducing polymers discussed above generally are commercially provided in a powder form. For example, a selected polymer such as poly(n-butyl methacrylate), is dissolved in a suitable solvent. A solution comprising between about 5% and about 10% of poly(n-butyl methacrylate) in methyl ethyl ketone, for example, can be prepared. The polymer solution can, for example, be applied to the insulating substrate 324 by the same spin coating process that was discussed above in connection with FIG. 11. A poly(n-butyl methacrylate) film is spin coated on the insulating substrate 324, having a thickness, for example, of about one micron. The film of poly(n-butyl methacrylate) is then removed from the insulating substrate 324 except for portions to constitute the low conductivity inducing layer regions 321, 322 and 323, for example by a wiping the polymer away with a swab dipped in methyl ethyl ketone. The gate electrodes 112 and 118 are then exposed by the same wiping process.

In the embodiment shown in FIG. 12 and discussed above, the low conductivity inducing layer regions 321, 322 and 323 are produced on the insulating substrate after the gate electrodes 312 and 318 are produced. In further embodiments according to the present invention, step 1215 is carried out before carrying out step 1210, or the two steps are carried out simultaneously.

At step 1220, gate dielectric regions 326 and 330 are provided on the insulating substrate 324. The function of gate dielectric regions 326 and 330 is to insulate the gate electrodes from the semiconductor layer 310. Accordingly, any organic or inorganic dielectric material that is compatible with the other materials with which it comes into contact in thin film transistors 302 and 304 can be used. In one exemplary embodiment according to the present invention, the gate dielectric layers 326 and 330 can be made barely large enough to effectively cover the gate electrodes 312 and 318. In another exemplary embodiment according to the present invention, the gate electrodes 312 and 318 are fabricated from a metal provided with an oxidized surface, and the oxidized surface serves as gate dielectric layers 326 and 330. For example, the gate electrodes 312 and 318 can be fabricated from aluminum, and the exposed surfaces are anodized to provide them with a dielectric coating.

In the embodiment shown in FIG. 12 and discussed above, the gate dielectric regions 326 and 330 are produced on the insulating substrate after the low conductivity inducing layer regions 321, 322 and 323 are produced. In further embodiments according to the present invention, step 1220 is carried out before carrying out step 1215, or the two steps are carried out simultaneously.

At step 1225, a layer 310 of pentacene is provided on the low conductivity inducing layer regions 321, 322 and 323, on the gate dielectric regions 326 and 330, and on the exposed portions of the insulating substrate 324. The pentacene can be applied using the same process as discussed above in connection with FIG. 11, in a manner suitable to allow the low conductivity inducing layer regions 321, 322 and 323 to affect the crystallinity of the applied pentacene. Low conductivity regions 346, 334 and 348 are thus generated within the pentacene layer 310.

At step 1230, source electrodes 306 and 314, and drain electrodes 308 and 316, are provided on the semiconductor layer 110 in alignment over the gate electrodes 312 and 318, respectively. These source electrodes 306 and 314, and drain electrodes 308 and 316 can be prepared in the same manner as was discussed above in regard to FIG. 11.

In another embodiment 1300 according to the present invention, thin film transistors 502 and 504 shown in FIGS. 5 and 6 having pentacene layer 510 are fabricated by an exemplary method shown in FIG. 13. Referring to FIG. 13, a silicon dioxide glass slide having a rough surface to inhibit pentacene crystallization is provided at step 1305 to serve as the insulating substrate 524. A surface of the insulating substrate 524 on which low conductivity inducing layer regions 522, 523 and 524 as well as gate electrodes 512 and 518 will be provided, is thoroughly cleaned. The surface of the insulating substrate 524 can be cleaned in the same manner as discussed above in connection with FIG. 11.

At step 1310, gate electrodes 512 and 518 are provided on the insulating substrate 524 in the same manner as discussed above in connection with FIG. 11.

At step 1315, low conductivity inducing polymer layer regions 522, 523 and 524 are provided on the insulating substrate in the same manner as discussed above in regard to FIG. 12. In the embodiment shown in FIG. 13, the low conductivity inducing layer regions 522, 523 and 524 are produced on the insulating substrate after the gate electrodes 512 and 518 are produced. In further embodiments according to the present invention, step 1315 is carried out before carrying out step 1310, or the two steps are carried out simultaneously.

At step 1320, high conductivity inducing layer regions 520 and 521 are provided on the insulating substrate 525. The high conductivity inducing layer regions 520 and 521 may as shown in FIG. 6 partially overlap the low conductivity inducing layer regions 522, 523 and 524. The high conductivity inducing layer regions 520 and 521 may be prepared in the same manner as discussed above in connection with FIG. 11.

In the embodiment shown in FIG. 13, the low conductivity inducing layer regions 522, 523 and 524 are produced on the insulating substrate before the high conductivity inducing layer regions 520 and 521 are produced. In further embodiments according to the present invention, step 1320 is carried out before carrying out step 1315, or the two steps are carried out simultaneously.

At step 1325, a layer 510 of pentacene is provided on the high conductivity inducing layer regions 520 and 521, and on the exposed portions of the low conductivity inducing layer regions 522, 523 and 524. The pentacene is applied using the same process as discussed above in connection with FIG. 11, in such a manner to allow the high conductivity inducing layer regions 520 and 521 as well as the exposed portions of the low conductivity inducing layer regions 522, 523 and 524 to affect the crystallinity of the applied pentacene. High conductivity regions 528 and 530 and low conductivity regions 540, 560 and 562 are thus generated within the pentacene layer 510.

At step 1330, source electrodes 506 and 514, and drain electrodes 508 and 516, are provided on the semiconductor layer 510 in alignment over the gate electrodes 512 and 518, respectively. These source electrodes 506 and 514, and drain electrodes 508 and 516 can be prepared in the same manner as was discussed above in regard to FIG. 11.

In another embodiment according to the present invention, thin film transistors 702 and 704 shown in FIGS. 7 and 8 having pentacene layer 710 are fabricated by an exemplary method 1400 shown in FIG. 14. Referring to FIG. 14, a silicon dioxide glass slide having a rough surface to inhibit pentacene crystallization is provided at step 1405 to serve as the insulating substrate 724. A surface of the insulating substrate 724 on which a low conductivity inducing layer 726 will be provided, is thoroughly cleaned in the same manner as discussed above in connection with FIG. 11.

At step 1410, gate electrodes 712 and 718 are provided on the insulating substrate 724 in the same manner as discussed above in connection with FIG. 11.

At step 1415, a low conductivity inducing polymer layer 726 is provided on the insulating substrate. A suitable solution of a low conductivity inducing polymer such as poly(n-butyl methacrylate) is provided in the same manner as discussed above in connection with FIG. 12. The polymer solution can, for example, be applied to the insulating substrate 724 by the same spin coating process discussed above. A film of poly(n-butyl methacrylate) is spin coated on the insulating substrate 124, having a thickness, for example, of about one micron. The film is then removed from the insulating substrate 124 except for portions to constitute the low conductivity inducing layer 726, for example by a wiping the polymer away with a swab dipped in methyl ethyl ketone.

At step 1420, high conductivity inducing layer regions 720 and 722 are provided on the low conductivity inducing polymer layer 726. A suitable solution of a high conductivity inducing polymer such as poly(4-vinylpyridine), is provided in the same manner as discussed above in connection with FIG. 11. The polymer solution can, for example, be applied to the low conductivity inducing polymer layer 726 by the same spin coating process and under the same processing conditions discussed above in connection with step 1115 of FIG. 11. A film of poly(4-vinylpyridine) is spin coated on the low conductivity inducing layer 726, having a thickness, for example, of about one micron. The film is then removed from the low conductivity inducing layer 726 except for portions to constitute the high conductivity inducing layer regions 720 and 722, for example by a wiping the polymer away with a swab dipped in methyl ethyl ketone.

At step 1425, a layer 710 of pentacene is provided on the high conductivity inducing layer regions 720 and 722, and on the exposed portions of the low conductivity inducing polymer layer 726. The pentacene is applied by the same process as discussed above, in a manner that is suitable to allow the high conductivity inducing layer regions 720 and 722 as well as the exposed portions of the low conductivity inducing polymer layer 726 to affect the crystallinity of the applied pentacene. High conductivity regions 728 and 730 and low conductivity regions 732, 734 and 736 are thus generated within the pentacene layer 710.

At step 1430, source electrodes 706 and 714 and drain electrodes 708 and 716 are provided on the semiconductor layer 710 overlying the high conductivity inducing layer regions 720 and 722. These electrodes may also partially overlie the portions of the low conductivity inducing polymer layer 726 that are in contact with the semiconductor layer 710. The source electrodes 706 and 714 and drain electrodes 708 and 716 can be prepared in the same manner as was discussed above in regard to FIG. 11.

In another embodiment according to the present invention, thin film transistors 902 and 904 shown in FIG. 9 having pentacene layer 910 are fabricated by an exemplary method 1500 shown in FIG. 15. Referring to FIG. 15, a silicon dioxide glass slide having a rough surface to inhibit pentacene crystallization is provided at step 1505 to serve as the insulating substrate 925. A surface of the insulating substrate 925 on which a high conductivity inducing layer 920 will be provided, is thoroughly cleaned in the same manner as discussed above in connection with FIG. 11.

At step 1510, gate electrodes 912 and 918 are provided on the insulating substrate 925 in the same manner as discussed above in connection with FIG. 11.

At step 1515, a high conductivity inducing polymer layer 920 is provided on the insulating substrate. A suitable solution of a high conductivity inducing polymer such as poly(4-vinylpyridine) is provided in the same manner as discussed above in connection with FIG. 11. The polymer solution can, for example, be applied to the insulating substrate 925 by the same spin coating process and under the same processing conditions discussed above in connection with step 1115 of FIG. 11. A film of poly(4-vinylpyridine) is spin coated on the insulating substrate 925, having a thickness, for example, of about one micron. The film is then removed from the insulating substrate 925 except for portions to constitute the high conductivity inducing layer 920, for example by a wiping the polymer away with a swab dipped in methyl ethyl ketone.

At step 1520, low conductivity inducing layer regions 932, 934 and 936 are provided on the high conductivity inducing polymer layer 920. A suitable solution of a low conductivity inducing polymer such as poly(n-butyl methacrylate) is provided in the same manner as discussed above in connection with FIG. 12. The polymer solution can, for example, be applied to the high conductivity inducing polymer layer 920 by the same spin coating process and under the same processing conditions discussed above in connection with step 1215 of FIG. 12. A film of poly(n-butyl methacrylate) is spin coated on the high conductivity inducing layer 920, having a thickness, for example, of about one micron. The film is then removed from the high conductivity inducing layer 920 except for portions to constitute the low conductivity inducing layer regions 932, 934 and 936, for example by a wiping the polymer away with a swab dipped in methyl ethyl ketone.

At step 1525, a layer 910 of pentacene is provided on the low conductivity inducing layer regions 932, 934 and 936, and on the exposed portions of the high conductivity inducing polymer layer 920. The pentacene is applied by the same process as discussed above, in a manner that is suitable to allow the low conductivity inducing layer regions 932, 934 and 936 as well as the exposed portions of the high conductivity inducing polymer layer 920 to affect the crystallinity of the applied pentacene. High conductivity regions 922 and 924 and low conductivity regions 926, 928 and 930 are thus generated within the pentacene layer 910.

At step 1530, source electrodes 906 and 914 and drain electrodes 908 and 916 are provided on the semiconductor layer 910 overlying regions of the high conductivity inducing polymer layer 920 that are in contact with the semiconductor layer 910. These electrodes may also partially overlie low conductivity inducing polymer layer regions 932, 934 and 936. The source electrodes 906 and 914 and drain electrodes 908 and 916 can be prepared in the same manner as was discussed above in regard to FIG. 11.

In another embodiment according to the present invention, thin film transistors 1002 and 1004 shown in FIG. 10 having pentacene layer 1012 are fabricated by an exemplary method 1600 shown in FIG. 16. Referring to FIG. 16, a silicon dioxide glass slide having a rough surface to inhibit pentacene crystallization is provided at step 1605 to serve as the insulating substrate 1024, in the same manner as discussed in connection with step 1405 of FIG. 14. At step 1610, gate electrodes 1018 and 1020 are provided on the insulating substrate 1024 in the same manner as discussed above in connection with step 1410 of FIG. 14. At step 1615, a low conductivity inducing polymer layer 1024 is provided on the insulating substrate in the same manner as discussed in connection with step 1415 of FIG. 14. At step 1620, high conductivity inducing layer regions 1010 and 1016 are provided on the low conductivity inducing polymer layer 1024 in the same manner as discussed above in connection with step 1420 of FIG. 14.

At step 1625, source electrodes 1006 and 1012 and drain electrodes 1008 and 1014 are provided on the high conductivity inducing layer regions 1010 and 1016. The source electrodes 1006 and 1012 and drain electrodes 1008 and 1014 can be prepared in the same manner as was discussed above in regard to FIG. 11.

At step 1630, a layer 1010 of pentacene is provided on the high conductivity inducing layer regions 1010 and 1016, on the source electrodes 1006 and 1012 and drain electrodes 1008 and 1014, and on the exposed portions of the low conductivity inducing polymer layer 1024. The pentacene is applied by the same process as discussed above, in a manner that is suitable to allow the high conductivity inducing layer regions 1010 and 1016 as well as the exposed portions of the low conductivity inducing polymer layer 1024 to affect the crystallinity of the applied pentacene. High conductivity regions 1028 and 1030 and low conductivity regions 1032, 1034 and 1036 are thus generated within the pentacene layer 1010.

FIGS. 11–16 as discussed above relate to exemplary embodiments of methods according to the present invention for fabrication of the devices shown in FIGS. 1–10, employing pentacene for fabrication of the semiconductor layer. It is to be understood, however, that the semiconductor layers of such devices can be fabricated from other materials. In further exemplary embodiments according to the present invention, a bithiophene such as 5,5'-bis-(4-ethylphenyl)2,2'-bithiophene or 5,5'-bis-(8-hexylfluorine-1-yl)2,2'-bithiophene is employed as the semiconductor. In additional exemplary embodiments according to the present invention, a thiophene such as sexithiophene or a benzothiophene dimer is employed as the semiconductor. Further exemplary thiophene compounds that can be used include: 2,5-linked thiophene tetramers, pentamers, and hexamers, either unsubstituted or substituted at the terminal 5 positions with linear alkyl or alkoxyalkyl chains of about 4 to about 12 atoms in length; anthradithiophene and terminal dialkyl derivatives thereof, including for example dihexylanthradithiophene; regioregular poly (3-hexylthiophene); and co-oligomers of 2,5-linked thiophene rings and 1,4-linked benzene rings about 5 rings long, either unsubstituted or substituted as described for the thiophene oligomers, including for example 1,4-bis(5-(5-hexylthien-2-yl)thien-2-yl)benzene (DHT4Ph). DHT4Ph can be synthesized according to procedures described for hexylated 5- and 6-ring compounds in W. Li et al, Chem. Mater., Vol. 11, page 458 (1999), using 1,4-diiodobenzene as the source of the benzene ring. Other substituted and unsubstituted acenes such as tetracene and hexacene for example, other bithiophenes, other thiophenes, phthalocyanines including for example copper phthalocyanine and perfluorinated copper phthalocyanine, naphthalene-1,4,5,8-tetracarboxylic diimide compounds, naphthalene-1,4,5,8-tetracarboxylic dianhydride, and 11,11,12,12-tetracyanonaphtho-2,6-quinodimethane, for example, can also be used. It is to be understood that the foregoing classes and species of semiconductors can be used, if available, in monomeric, oligomeric and polymeric forms. See, for example, Dimitrakopoulos et al. U.S. Pat. No. 5,981,970, Bauntech, et al. U.S. Pat. No. 5,625,199, Garnier, et al. U.S. Pat. No. 5,347,144, and Klauck, Hagen et al., "Deposition: Pentacene organic thin-film transistors and ICs," Solid State Technology, Vol. 43, Issue 3, March 2, on pp. 63–75. The entirety of the foregoing patents and article cited in this paragraph are hereby incorporated herein by reference in their entirety. Other organic compounds that are capable of transporting charge carriers when formed into a film can also be used. Further, inorganic semiconductors and mixed and hybrid organic and inorganic semiconductors can be used.

Appropriate polymers for fabricating layers and regions that induce high and low conductivity in an adjacent semiconductor layer are selected for a particular semiconductor chosen for use. In one embodiment according to the present invention, given a voltage of −50V from source to drain across a test transistor, the mobility in the high conductivity regions of the semiconductor is desirably at least about 0.01 $cm^2/Vs$, preferably at least about 0.1 $cm^2/Vs$, and more preferably at least about 1.0 $cm^2/Vs$, at room temperature. The structure of the high conductivity regions of the semiconductor desirably has an average crystal grain size of at least about 50 nanometers, and an average grain separation of less than about 20 angstroms. In one embodiment according to the present invention, the high conductivity regions of the semiconductor have an average crystal grain size of less than about 500 nanometers. In one embodiment according to the present invention, the mobility in the low conductivity regions of the semiconductor is desirably within a range between about $0.3 \times 10^{-7}$ $cm^2/Vs$ and about $1.5 \times 10^{-5}$ $cm^2/Vs$ at room temperature. In one embodiment according to the present invention, the conductivity in the high conductivity regions of the semiconductor is at least about 100 times as large as the conductivity in the low conductivity regions of the semiconductor. In another embodiment according to the present invention, the average crystal grain size within the high conductivity regions of the semiconductor desirably is at least about 10 times as large the average crystal grain size within the low conductivity regions of the semiconductor. In a further embodiment according to the present invention, the average separation between crystal grains within the low conductivity regions of the semiconductor desirably is at least about 10 times as large the average separation between crystal grains within the high conductivity regions of the semiconductor.

In one embodiment according to the present invention, a raster scanning method is employed to deposit a uniform coating of a selected semiconductor material onto a substrate having test regions of selected high and low conductivity inducing polymers. This method provides control over the processing conditions and facilitates testing of the compatibility and performance of the selected materials. The substrate can be provided with test regions of selected high and low conductivity inducing polymers as detailed in steps 1305, 1310 and 1320 discussed above in connection with FIG. 13, for example. Preparation of gate electrodes and of source and drain electrodes can be carried out as detailed above in steps 1315 and 1330 of FIG. 13. A semiconductor layer can be provided in execution of step 1325 shown in exemplary FIG. 13 by employing the raster scanning method.

According to the raster scanning method, a source of semiconductor material is provided, such as pentacene for example. The semiconductor material is then heated to a suitable vaporization temperature and is sprayed onto the test regions of selected high and low conductivity inducing polymers by the raster scanning method. A spray source such as a nozzle is indexed back and forth in a zigzag raster pattern over the surfaces of the test regions of selected high and low conductivity inducing polymers in order to systematically cover such surfaces with a uniform coating of the selected semiconductor. Control of the volume over unit time of the heated semiconductor material that is emitted from the spray source, and control over the raster pattern and speed, further allow control over the thickness of the semiconductor coating layer. The distance between the spray source and the surfaces of the test regions of selected high and low conductivity inducing polymers can be controlled for uniformity in preparing a test device, and can be systematically varied from one test device to another. In this manner, uniformity of the semiconductor coating in a given test device is encouraged, and the optimum distance between the spray source and the surfaces of the test regions for the selected materials can readily be determined. Further, the temperature of the surfaces of the test regions of the polymers and of the semiconductor material upon contact with the surfaces of the test regions of selected high and low conductivity inducing polymers can be controlled in order to adjust the resulting crystallinity of the semiconductor coating.

FIGS. 11–16 as discussed above relate to exemplary and non limiting embodiments of methods according to the present invention. Other suitable methods for making the exemplary devices shown in FIGS. 1–10 can also be used. For example, other processes can be used for providing the high and low conductivity inducing polymer layers and regions on the insulating substrates. Such other processes can include, for example, ink jet printing, vapor deposition, liquid film casting, spin casting, evaporative film casting, and thermal transfer imaging. High and low conductivity inducing polymer layers can be patterned, for example, by photolithography and oxygen plasma etching. Continuous coatings can be converted into defined layer regions by laser ablation, for example. Further processes that may be useful in making the exemplary devices shown in FIGS. 1–10 are disclosed in U.S. patent application Ser. No. 10/669,780, filed concurrently herewith, entitled "Semiconductor Layers with Roughness Patterning", which issued on Nov. 29, 2005 U.S. Pat. No. 6,969,634. This patent is assigned to Lucent Technologies Inc., and is hereby incorporated by reference herein in its entirety.

In one embodiment according to the present invention, high and low conductivity inducing polymer layers and regions are provided on insulating substrates by a process comprising laser induced thermal transfer imaging. For example, a laser can be used to induce the patterned transfer of a high or low conductivity inducing polymer material from a donor film to a receiver film. Each type of polymer, inducing either high or low conductivity, typically is individually printed in a separate printing step, and one donor film at a time is printed. In another embodiment according to the present invention, multiple polymers are simultaneously printed. A suitable donor film may comprise a MYLAR polyethylene terephthalate base having a thickness of 2 mils, having a semitransparent coating of sputtered chromium, nickel or aluminum with a thickness that allows transmittance of about 50% of visible light. The desired high or low conductivity inducing polymer to be transfer printed is then suitably coated onto the sputtered metal surface of the donor film. The receiver film may be constituted by a film of the selected insulating substrate material, and may comprise a supportive backing for the substrate that can later be removed. The donor and receiver films are then assembled together with the desired high or low conductivity inducing polymer facing the substrate. The assembled films are then sized and fitted onto a printer cylinder with the donor film facing out. Alternatively, if the receiver film is transparent then the receiver film can face out. Typically, the receiver film is wrapped around the drum. Then the donor film is wrapped around the receiver. The laser is directed in through the back of the donor film. In this manner, a donor film can be unloaded and another donor film can then be loaded in its place. The printer cylinder may, for example, have a diameter of about 14 inches.

A laser head is provided adjacent to the printer cylinder, aimed to direct laser light onto the cylinder surface through the assembled films. The laser head may, for example, include 200 lasers having a collective beam width of 500 microns, providing a resolution of 2×5 microns. The exemplary laser spot size has a length of 5 microns across the head, and a width of 2 microns in the direction of printer cylinder rotation. The laser head includes a lead screw for guiding the laser head over the longitudinal axis of the printer cylinder. In operation of the printer, the cylinder turns at a selected rotation rate per unit time, and the lead screw systematically advances the laser head over the printer cylinder surface in a barber pole fashion. The lasers within the laser head can be individually energized for precise pattern control. As the laser head is guided over the surface of the printer cylinder, laser light is directed in a precise desired pattern corresponding to the desired high or low conductivity inducing polymer layers or regions on the insulating substrate. Typically, the precise pattern is computer generated. In the precise areas where laser energy enters the donor film, the high or low conductivity inducing polymer is transferred onto the insulating substrate. Fine accuracy of the printing pattern is needed. This accuracy can be achieved by proper programming of the computer guidance systems. Further advantageous embodiments of laser induced thermal transfer imaging processes that can be employed in practice of various aspects of the present invention are disclosed in U.S. patent application Ser. No. 10/949,867, which claimed priority to Provisional U.S. patent application Ser. No. 60/505,533 filed concurrently herewith, entitled "Method for Increasing Mobility of Vapor Deposited Pentacene." This patent application is assigned to E. I. du Pont de Nemours and Company, and is hereby incorporated by reference herein in its entirety.

Processes and apparatus relating to laser induced thermal transfer imaging are disclosed in the following patent documents for example, which are hereby incorporated by reference herein in their entirety: Blanchet-Fincher U.S. Pat. No. 5,192,580; Blanchet-Fincher U.S. Pat. No. 5,288,528; Blanchet-Fincher U.S. Pat. No. 5,523,192; Blanchet-Fincher U.S. Pat. No. 5,563,019; Blanchet-Fincher U.S. Pat. No. 5,766,819; Blanchet-Fincher U.S. Pat. No. 5,840,463; Blancher-Fincher U.S. Pat. No. 6,143,451; Blancher-Fincher et al. U.S. Pat. No. 6,146,792; Blanchet-Fincher U.S. Patent Pub. No. 2002/0149315; Blanchet-Fincher et al. PCT published application WO 01/87634 A2 dated Nov. 22, 2001; Blanchet-Fincher et al. PCT published application WO 02/08801 A1 dated Jan. 31, 2002; and Blanchet-Fincher et al. PCT published application WO 02/092352 A1 dated Nov. 21, 2002. Apparatus for carrying out laser induced thermal transfer imaging are commercially available from Creo Inc., 3700 Gilmore Way, Burnaby, British Columbia, V5G 4M1, Canada. For example, Creo Trendsetter thermal platesetters can be employed.

Optimization of laser induced thermal transfer imaging processes includes proper formulation of the polymer materials to be transfer printed. Variables to be addressed regarding the polymers include glass transition temperature (Tg) and melt viscosity. For example, polymers having a glass transition temperature within a range between about −20° C. and about 100° C. may provide adequate film stability while avoiding excessive film brittleness. Further for example, polymers having a melt viscosity within a range between about 10 centipoise (CPS) and about 100 CPS may provide adequate workability for coating onto a donor film while having adequate body to form a layer of a desired thickness. Polymer melt viscosity generally increases with increasing average molecular weight. A desired film thickness may be about one micron, for example. Variables to be addressed regarding solvent systems for the polymers include substrate wetting, drying performance, and polymer dispersion or dissolution. Suitable solvent systems are able to wet the substrate surfaces of both donor and receiver films, are able to evaporate to yield a uniform dry film having a surface area of at least about a square foot within a reasonable working time, allow preparation of a polymer layer of a desired thickness, and either disperse or dissolve the polymer. A given solvent wets a substrate if the contact angle of a drop of solvent on the substrate is less than about 90°. Organic solvents or surfactants added to aqueous systems are generally needed in order to wet the sputtered metal surface of the donor film. Variables to be addressed regarding the resulting polymer films include strain to break, surface energy and cohesive energy. In order for the polymer coating to be discontinuously transferred from the donor film to the recipient film, the polymer coating must be able to cleanly break without stretching or distortion at the boundaries defined by the laser head as it is indexed over the cylinder surface. Various materials can be added to the polymers and solvent system of a composition to be used in furtherance of such optimization. For example, copolymers, coating aids, plasticizers, flow additives, slip agents, anti-halation agents, antistatic agents, surfactants, dispersants, and other agents known to be used in the formulation of coatings may be added.

A series of test transistors were fabricated in accordance with the present invention and tested for conductivity. For the preparation of each test transistor, a silicon dioxide glass slide was provided to serve as the insulating substrate. A surface of the silicon dioxide slide was thoroughly cleaned in the same manner as discussed above in connection with FIG. 11. Gate electrodes formed from aluminum were then provided on the insulating substrate. A selected polymer layer was then spin coated onto the insulating substrate, and regions of the layer were removed by swabbing with a suitable solvent. A layer of a selected semiconductor was then provided on the layer regions and on the exposed portions of the silicon dioxide glass slide. In order to provide the semiconductor layer, the semiconductor material was heated to a suitable vaporization temperature and was deposited onto the test regions of the selected polymers by the bell jar evaporator method. The glass slide was placed in a suitable vacuum chamber such as a bell jar, which was then evacuated. A source of the semiconductor was also placed in the vacuum chamber and heated to vaporize and deposit the semiconductor over the test regions. Gold source and drain electrodes were then provided on the semiconductor layer in alignment over the gate electrodes, prepared in the same manner as was discussed above in regard to FIG. 11.

FIG. 17 shows, in Table 1, the results of 11 series of trials that were carried out. The semiconductor in series 1–5 was pentacene. The semiconductor in series 6–8 was 5,5'-bis-(4-ethylphenyl)2,2'-bithiophene, abbreviated as 2PTTP2. The semiconductor in series 9–11 was 5,5'-bis-(8-hexylfluorine-1-yl)2,2'-bithiophene, abbreviated as DHFTTF. The selected polymer in series 1, 7 and 10 was poly(4-vinylpyridine), abbreviated as PVPYR. The selected polymer in series 2, 8 and 11 was poly(vinylidene difluoride-co-methyl-vinyl-ether), abbreviated as PVDFMVE. The selected polymer in series 3, 6 and 9 was poly(n-butyl methacrylate), abbreviated as PBMA. The selected polymer in series 4 and 5 was poly(para-vinylphenol), abbreviated as PVPH. Table 1 indicates the quantity of samples within each of the eleven series of transistors that were tested. The mobility within regions of the semiconductor layers in contact with the selected polymers was measured and reported in $cm^2/Vs$. The standard deviation of such mobility among all samples was also reported. The threshold voltage in volts was measured and reported, together with the standard deviation of such threshold voltage among all samples. The on/off ratio of conductivity with a zero gate current was measured and reported. The subthreshold swing voltage per decade was measured and reported. The subthreshold swing voltage per decade is a measure of the gate voltage change required to increase the current flowing in the test transistors by a factor of ten. In trial series 1–3 and 5, the silicon dioxide slides were heated to the indicated temperatures during semiconductor deposition. In the other trial series, the slides were at ambient temperature during such deposition. The test measurements were obtained at ambient temperature.

The test results in Table 1 showed in series 1–5 that the conductivity for a pentacene semiconductor layer was relatively high when deposited over poly(4-vinylpyridine) or poly(para-vinylphenol), and relatively low when deposited over poly(vinylidene difluoride-co-methyl-vinyl-ether) or poly(n-butyl methacrylate). The test results further showed in series 6–8 that the conductivity for a 5,5'-bis-(4-ethylphenyl)2,2'-bithiophene semiconductor layer was relatively high when deposited over poly(4-vinylpyridine), and relatively low when deposited over poly(vinylidene difluoride-co-methyl-vinyl-ether) or poly(n-butyl methacrylate). The test results also showed in series 9–11 that the conductivity for a 5,5'-bis-(8-hexylfluorine-1-yl)2,2'-bithiophene semiconductor layer was relatively high when deposited over poly(4-vinylpyridine), and relatively low when deposited over poly(vinylidene difluoride-co-methyl-vinyl-ether) or poly(n-butyl methacrylate).

While the present invention has been disclosed in the context of various aspects of presently preferred embodiments, it will be recognized that the invention may be suitably applied to other environments consistent with the claims which follow.

We claim:

1. A semiconductor apparatus, comprising:
   a substrate having a substrate surface;
   a layer of a first material overlying a first region of said substrate surface;
   a layer of a first material overlying a second region of said substrate surface;
   a layer of a second material overlying a second region of said substrate surface;
   a layer of a semiconductor overlying said layer of first material and overlying said layer of second material; and
   a first region of said layer of semiconductor overlying said layer of first material and including crystal grains having a first average crystal grain size, a second region of said layer of semiconductor overlying said layer of second material and including crystal grains having a second average crystal grain size, said first average crystal grain size being substantially different from said second average crystal grain size.

2. The semiconductor apparatus of claim 1, in which said first material is a polymer.

3. The semiconductor apparatus of claim 1, in which:
   said first region of said layer of semiconductor has a first conductivity;
   said second region of said layer of semiconductor has a second conductivity; and
   said first conductivity is at least about 100 times as large as said second conductivity.

4. The semiconductor apparatus of claim 1, in which said first average crystal grain size is at least about 10 times as large as said second average crystal grain size.

5. The semiconductor apparatus of claim 1, in which an average separation between crystal grains within said second region of said layer of semiconductor is at least about 10 times as large as an average separation between crystal grains within said first region of said layer of semiconductor.

6. The semiconductor apparatus of claim 1, in which said semiconductor is selected from the group consisting of: acenes, thiophenes, bithiophenes, phthalocyanines, naphthalene-1,4,5,8-tetracarboxylic diimide compounds, naphtalene-1,4,5,8-tetracarboxylic dianhydride, and 11,11,12,12-tetracyanonaphtho-2,6-quinodimethane.

7. The semiconductor apparatus of claim 1, further comprising:
   a first gate electrode;
   a first source electrode; and
   a first drain electrode;
   said first source and drain electrodes being in spaced apart conductive contact with a first channel portion of either said first or said second region of said layer of semiconductor, said first gate electrode being positioned to control a conductivity of said first channel portion.

8. The semiconductor apparatus of claim 1, further comprising a layer of a second material overlying said second region of said substrate surface, said second region of said layer of semiconductor overlying said layer of said second material.

9. The semiconductor apparatus of claim 1, in which said layer of first material overlies said second region of said substrate surface.

10. The semiconductor apparatus of claim 2, in which said second material is a polymer.

11. The semiconductor apparatus, comprising:
   a substrate having a substrate surface;
   a layer of a first material overlying a first region of said substrate surface;
   a layer of a second material overlying a second region of said substrate surface;
   a layer of a semiconductor overlying said layer of first material and overlying said layer of second material; and
   a first region of said layer of semiconductor overlying said layer of first material and having a first conductivity, a second region of said layer of semiconductor overlying said layer of second material and having a second conductivity said first conductivity being substantially different from said second conductivity.

12. The semiconductor apparatus of claim 11, in which said layer of first material overlies said second region of said substrate surface.

13. The semiconductor apparatus of claim 1, in which said second material is a polymer.

14. The semiconductor apparatus of claim 3, in which said second material is selected from the group consisting of: poly(-butyl methacrylate), poly(vinylidene difluoride-co-methyl vinyl ether), polystyrene, poly(p-methoxystyrene), poly(vinylidene difluoride), poly(vinyl acetate), poly(vinyl propionate), poly(methoxy acetate), poly(n-propyl methacrylate), poly(isopropyl methacrylate), poly(n-pentyl methacrylate), poly(vinylidene difluoride-co-ethyl vinyl ether), poly(vinylidene difluoride-co-propyl vinyl ether), poly(dimethylaminoethyl methacrylate), poly(dimethylaminopropyl methacrylate), poly(aminopropyl methacrylate), poly(diethylaminoethyl methacrylate), and blends.

15. The semiconductor apparatus of claim 14, in which said second material comprises poly(n-butyl methacrylate).

16. The semiconductor apparatus of claim 14, in which said second material comprises poly(vinylidine difluoride-co-methyl vinyl ether).

17. The semiconductor apparatus of claim 13, in which said second material comprises charge carrier traps.

18. The semiconductor apparatus of claim 3, in which said first material is selected from the group consisting of: poly(para-vinyl phenol), poly(4-vinylpyridine), poly(2-vinylnaphthalene), poly(meta-vinyl phenol), poly(ortho-vinyl phenol), poly(para-vinyl phenol)-co-2-hydroxyethylmethacrylate, poly(2-vinylpyridine), poly(2-vinylnaphthalene-co-2-ethylhexyl acrylate, poly(1-vinylnaphthalene), and blends.

19. The semiconductor apparatus of claim 18, in which said first material comprises poly(4-vinylpyridine).

20. The semiconductor apparatus of claim 18, in which said first material comprises poly(2-vinylnaphthalene).

21. The semiconductor apparatus of claim 11, in which said first material is a polymer.

22. The semiconductor apparatus of claim 11, in which said first conductivity is at least about 100 times as large as said second conductivity.

23. The semiconductor apparatus of claim 11, in which said layer of semiconductor comprises crystal grains, and in which an average crystal grain size within said first region of said layer of semiconductor is at least about 10 times as large as an average crystal grain size within said second region of said layer of semiconductor.

24. A semiconductor apparatus, comprising:
a substrate having a substrate surface;
a layer of a first material overlying a first region of said substrate surface;
a layer of a semiconductor overlying said layer of first material and overlying a second region of said substrate surface;
a first region of said layer of semiconductor, overlying said layer of first material and having a first conductivity, a second region of said layer of semiconductor, overlying said second region of said substrate surface and having a second conductivity, said first conductivity being substantially different from said second conductivity;
first and second gate electrodes;
first and second source electrodes; and
first and second drain electrodes;
said first source and drain electrodes being in spaced apart conductive contact with a first channel portion of either said first region or said second region of said layer of semiconductor, said first gate electrode being positioned to control a conductivity of said first source and first drain electrodes being in spaced apart conductive contact with a first channel portion of either said first region or said second region of said layer of semiconductor, said first gate electrode being positioned to control a conductivity of said first channel portion;
said second source and second drain electrodes being in spaced apart conductive contact with a second channel portion of either said first region or said second region of said layer of semiconductor, said second gate electrode being positioned to control a conductivity of said second channel portion;
wherein said first and second channel portions are mutually isolated by an interposed region of said layer of semiconductor having a substantially lower conductivity than said conductivity of said first and second channel portions.

25. The semiconductor apparatus of claim 24, further comprising a layer of a second material overlying said second region of said substrate surface, said second region of said layer of semiconductor overlying said layer of said second material.

26. The semiconductor apparatus of claim 24, in which said layer of first material overlies said second region of said substrate surface.

27. A semiconductor apparatus, comprising:
a substrate having a substrate surface; a layer of a first material overlying a first region of said substrate surface; a layer of a second material overlying a second region of said substrate surface;
a layer of a semiconductor overlying said layer of first material and overlying said layer of second material; and
a first region of said layer of semiconductor overlying said layer of first material and including crystal grains having a first average crystal grain size, a second region of said layer of semiconductor overlying said layer of second material and including crystal grains having a second average crystal grain size, said first average crystal grain size being substantially larger than said second average crystal grain size.

28. The semiconductor apparatus of claim 27, in which said first average crystal grain size is at least about 10 times as large as said second average crystal grain size.

29. The semiconductor apparatus of claim 27, in which an average separation between crystal grains within said second region of said layer of semiconductor is at least about 10 times as large as an average separation between crystal grains within said first region of said layer of semiconductor.

30. The semiconductor apparatus of claim 27, in which: said first region of said layer of semiconductor has a first conductivity; and second region of said layer of semiconductor has a second conductivity; and said first conductivity is at least about 100 times as large as said second conductivity.

31. The semiconductor apparatus of claim 27, further comprising:
a first gate electrode;
a first source electrode; and
a first drain electrode; said first source and drain electrodes being in spaced apart conductive contact with a first channel portion of either said first region or said second of said layer of semiconductor, said first gate electrode being positioned to control a conductivity of said first channel portion.

32. The semiconductor apparatus of claim 27, in which said layer of first material overlies said second region of said substrate surface.

* * * * *

UNITED STATES PATENT AND TRADEMARK OFFICE
CERTIFICATE OF CORRECTION

| | |
|---|---|
| PATENT NO. | : 7,122,828 B2 |
| APPLICATION NO. | : 10/671303 |
| DATED | : October 17, 2006 |
| INVENTOR(S) | : Zhenan Bao, Howard Edan Katz and Jeffrey Scott Meth |

It is certified that error appears in the above-identified patent and that said Letters Patent is hereby corrected as shown below:

Column 27, lines 61-62, cancel the text "a layer of a first material overlying a second region of said substrate surface;".

Column 28, lines 42-46, cancel the text "8. The semiconductor apparatus of claim 1, further comprising a layer of a second material overlying said second region of said substrate surface, said second region of said layer of semiconductor overlying said layer of said second material.".

Column 28, line 50, the claim reference numeral "2" should read -- 1 --.

Column 29, line 4, the claim reference numeral "1" should read -- 11 --.

Column 29, line 6, the claim reference numeral "3" should read -- 10 --.

Column 29, line 22, the claim reference numeral "13" should read -- 10 --.

Column 29, line 24, the claim reference numeral "3" should read -- 2 --.

Column 29, lines 62-66, cancel the text "drain electrodes being in spaced apart conductive contact with a first channel portion of either said first region or said second region of said layer of semiconductor, said first gate electrode being positioned to control a conductivity of said first source and".

Column 30, line 60, after "second", insert -- region --.

Signed and Sealed this
Twenty-ninth Day of January, 2013

David J. Kappos
*Director of the United States Patent and Trademark Office*